United States Patent
Lee et al.

(10) Patent No.: US 11,526,201 B2
(45) Date of Patent: Dec. 13, 2022

(54) PANEL BOTTOM SHEET AND DISPLAY INCLUDING THE SAME

(71) Applicant: Samsung Display Co., Ltd., Yongin-si (KR)

(72) Inventors: Kang Woo Lee, Seoul (KR); Boo Kan Ki, Yongin-si (KR); June Hyoung Park, Seoul (KR); Sun Hee Oh, Seoul (KR); Dong Hyeon Lee, Seoul (KR); Jeong In Lee, Yeonggwang-gun (KR); Hyuk Hwan Kim, Suwon-si (KR); Seong Sik Choi, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 202 days.

(21) Appl. No.: 16/924,030

(22) Filed: Jul. 8, 2020

(65) Prior Publication Data
US 2021/0034121 A1 Feb. 4, 2021

(30) Foreign Application Priority Data
Aug. 2, 2019 (KR) .................. 10-2019-0094504

(51) Int. Cl.
*G06F 1/20* (2006.01)
*G06F 3/041* (2006.01)
(Continued)

(52) U.S. Cl.
CPC ............ *G06F 1/203* (2013.01); *G06F 3/0412* (2013.01); *H05K 7/20963* (2013.01); *H01L 51/529* (2013.01)

(58) Field of Classification Search
CPC .. H05K 7/20963; H05K 5/0017; H05K 1/189; H05K 7/20954; H05K 7/2039;
(Continued)

(56) References Cited

U.S. PATENT DOCUMENTS 9,624,379 B2    4/2017  Do et al.
10,243,164 B2 * 3/2019  Oh ...................... H01L 51/5281
(Continued)

FOREIGN PATENT DOCUMENTS

EP    2602291        6/2013
EP    3067775 A1 *  9/2016  ....... G02F 1/133308
(Continued)

OTHER PUBLICATIONS

Yu-Sheng et al., Top-Emission Organic Light Emitting Diode Fabrication Using High Dissipation Graphite Substrate, International Journal of Photoenergy, Jul. 2, 2014, 6 pages, vol. 2014, Article ID 319390, Hindawi Publishing Corporation, Changhua, Taiwan.
(Continued)

*Primary Examiner* — Michael A Matey
(74) *Attorney, Agent, or Firm* — H.C. Park & Associates, PLC

(57) ABSTRACT

A panel bottom sheet includes: a first heat dissipation layer; a second heat dissipation layer having circumferential side surfaces located further inside than circumferential side surfaces of the first heat dissipation layer in a plan view, the second heat dissipation layer including: a main heat dissipation pattern including a first opening formed completely through the second heat dissipation layer in a thickness direction; and a heat dissipation substrate disposed directly on the second heat dissipation layer.

23 Claims, 18 Drawing Sheets

(51) Int. Cl.
*H05K 7/20* (2006.01)
*H01L 51/52* (2006.01)

(58) Field of Classification Search
CPC .. H05K 5/02; H05K 2201/10128; H05K 7/20;
H05K 2201/10106; H05K 1/0204; H05K
1/0203; H05K 1/0212; H05K 1/028;
H05K 1/147; H05K 2201/056; H05K
7/20409; H05K 1/0201; H05K 3/202;
H05K 7/20436; H05K 9/0054; H05K
9/0088; H05K 2201/055; H05K 1/144;
H01L 51/0097; H01L 2251/5338; H01L
27/3244; H01L 27/3262; H01L 51/529;
G09F 9/301; G06F 1/1616; G06F 1/1652;
G06F 1/1641; G06F 1/206; G06F 1/203;
G06F 3/0412; G02F 1/133628; H04N
9/3144; H04M 1/0266; H04M 1/0268
See application file for complete search history.

(56) References Cited

U.S. PATENT DOCUMENTS

| | | | |
|---|---|---|---|
| 10,796,613 | B2 | 10/2020 | Xu et al. |
| 10,892,441 | B2 | 1/2021 | Jung et al. |
| 10,893,603 | B2 | 1/2021 | Umeda et al. |
| 2014/0072813 | A1 | 3/2014 | Fujii et al. |
| 2016/0055793 | A1* | 2/2016 | Jang .......... B32B 5/18 428/408 |
| 2016/0066440 | A1* | 3/2016 | Choi .......... G06F 1/1637 361/679.3 |
| 2016/0268523 | A1* | 9/2016 | Kim .......... G02F 1/133308 |
| 2016/0270209 | A1* | 9/2016 | Cho .......... G06F 1/1652 |
| 2018/0146579 | A1* | 5/2018 | Kim .......... H05K 13/04 |
| 2018/0150108 | A1* | 5/2018 | Song .......... H05K 1/028 |
| 2018/0284934 | A1* | 10/2018 | Wu .......... G06F 1/1601 |
| 2018/0366679 | A1* | 12/2018 | Kim .......... B32B 27/286 |
| 2018/0366685 | A1* | 12/2018 | Park .......... H01L 51/5284 |
| 2019/0006615 | A1* | 1/2019 | Jung .......... H01L 51/5246 |
| 2019/0058150 | A1* | 2/2019 | Lee .......... H01L 51/529 |
| 2019/0081255 | A1* | 3/2019 | Kim .......... B32B 5/142 |
| 2019/0130796 | A1 | 5/2019 | Kang et al. |
| 2019/0165049 | A1* | 5/2019 | Kim .......... H01L 23/564 |
| 2019/0196641 | A1* | 6/2019 | Ryu .......... G06F 3/041 |
| 2019/0272407 | A1* | 9/2019 | Park .......... H01L 51/529 |
| 2019/0334114 | A1* | 10/2019 | Park .......... H05K 5/0017 |
| 2019/0346887 | A1* | 11/2019 | Park .......... G06F 1/1652 |
| 2020/0051881 | A1* | 2/2020 | Park .......... B32B 15/095 |
| 2020/0084875 | A1 | 3/2020 | Umeda et al. |
| 2021/0118337 | A1* | 4/2021 | Park .......... G09F 9/301 |

FOREIGN PATENT DOCUMENTS

| | | | |
|---|---|---|---|
| EP | 3506062 | 7/2019 | |
| EP | 3496177 B1 * | 1/2021 | ......... H01L 27/3246 |
| GB | 2569448 | 6/2019 | |
| KR | 10-2015-0005075 | 1/2015 | |
| KR | 10-1509494 | 4/2015 | |
| KR | 10-1542412 | 8/2015 | |
| KR | 10-2018-0045929 | 5/2018 | |
| KR | 10-1859723 | 5/2018 | |
| KR | 10-1890451 | 8/2018 | |
| WO | 2018/123480 | 7/2018 | |
| WO | 2019/041885 | 3/2019 | |

OTHER PUBLICATIONS

Extended European Search Report dated Jan. 21, 2014, issued in European Patent Application No. 20188594.4-1211.

* cited by examiner

10_8 = 40, 50, and 60

10_9 = 40, 50, 60, and 70

PANEL BOTTOM SHEET AND DISPLAY INCLUDING THE SAME

CROSS REFERENCE TO RELATED APPLICATION

This application claims priority from and the benefit of Korean Patent Application No. 10-2019-0094504 filed on Aug. 2, 2019, which is hereby incorporated by reference for all purposes as if fully set forth herein.

BACKGROUND

Field

Exemplary embodiments/implementations of the invention relate generally to a panel bottom sheet and a display including the same.

Discussion of the Background

Organic light emitting displays have advantages such as excellent properties of brightness, driving voltage, and response speed and polychrome and have been applied to a variety of products including smart phones. An organic light emitting display includes a display panel including organic light emitting diodes (OLED). In an OLED, a cathode electrode and an anode electrode are disposed with an organic emissive layer therebetween and the organic emissive layer generates visible rays connected to both electrodes when a voltage is applied to both the electrodes.

Organic light emitting displays are generally used in portable electronic devices such as smart phones and may be exposed to external impacts. Also, when excessive heat is generated in an OLED or a driving chip driving the same, there is concern that the OLED can be damaged by the heat. To protect the OLED from such risks, a functional sheet including functions of heat dissipation, impact buffering, and the like is attached to a bottom surface of a display panel.

The above information disclosed in this Background section is only for understanding of the background of the inventive concepts, and, therefore, it may contain information that does not constitute prior art.

SUMMARY

Devices constructed according to exemplary embodiments of the invention may provide a panel bottom sheet having improved efficiency and reduced cost in manufacturing process, and a display having the same.

Additional features of the inventive concepts will be set forth in the description which follows, and in part will be apparent from the description, or may be learned by practice of the inventive concepts.

According to one or more exemplary embodiments of the invention, a panel bottom sheet includes: a first heat dissipation layer; a second heat dissipation layer having circumferential side surfaces located further inside than circumferential side surfaces of the first heat dissipation layer in a plan view, the second heat dissipation layer including: a main heat dissipation pattern including a first opening formed completely through the second heat dissipation layer in a thickness direction; and a heat dissipation substrate disposed directly on the second heat dissipation layer.

The heat dissipation substrate may directly contact the circumferential side surfaces of the second heat dissipation layer.

The panel bottom sheet may further include a first coupling interlayer disposed between the first heat dissipation layer and the second heat dissipation layer, wherein at least a part of a top surface of the first coupling interlayer may be exposed by the second heat dissipation layer, and the exposed top surface of the first coupling interlayer directly contacts the heat dissipation substrate.

The first opening may include a through hole completely surrounded by the second heat dissipation layer in the plan view.

The heat dissipation substrate may be disposed in the first opening directly contacting an inner wall of the opening of the second heat dissipation layer.

The first coupling interlayer may be disposed in the first opening directly contacting the inner wall of the opening of the second heat dissipation layer.

The second heat dissipation layer may further include a plurality of sub-heat dissipation patterns separated from the main heat dissipation pattern having a linear shape extending in one direction, the second heat dissipation layer may further include a second opening formed completely through the second heat dissipation layer in a thickness direction, and a plurality of such second openings may be disposed between the sub-heat dissipation patterns and between the main heat dissipation pattern and the sub-heat dissipation pattern in the plan view.

The heat dissipation substrate may include polyamide-imide.

The first heat dissipation layer may include at least one of copper and silver, and the second heat dissipation layer may include at least one of graphite and carbon nanotubes.

The panel bottom sheet may further include: a bottom coupling member disposed below the first heat dissipation layer; and a heat dissipation paint disposed between the bottom coupling member and the first heat dissipation layer.

The heat dissipation paint may include a metal oxide material.

The panel bottom sheet may further include a digitizer disposed on the heat dissipation substrate.

According to one or more exemplary embodiments of the invention, a display includes: a display panel; and a panel bottom sheet disposed below the display panel, the panel bottom sheet including: a first heat dissipation layer; a second heat dissipation layer having circumferential side surfaces located further inside than circumferential side surfaces of the first heat dissipation layer in a plan view; a heat dissipation substrate disposed directly on the second heat dissipation layer; a bottom coupling member disposed below the first heat dissipation layer; and a heat dissipation paint disposed between the bottom coupling member and the first heat dissipation layer.

The heat dissipation paint may include a metal oxide material.

The panel bottom sheet may further include a buffering member disposed between the heat dissipation substrate and the display panel, the buffering member directly contacting the heat dissipation substrate, and wherein the display panel having a thickness of 120 μm to 180 μm.

The display may include: a flat area; and a bending area located on a periphery of the flat area. The display panel and the panel bottom sheet may overlap with the flat area and the bending area.

The second heat dissipation layer may overlap with the flat area and a part of the bending area, and the first heat dissipation layer may overlap with the flat area and an entire surface of the bending area.

The second heat dissipation layer may include a main heat dissipation pattern including a first opening formed completely through the second heat dissipation layer in a thickness direction, and the main heat dissipation pattern may be located in the flat area.

The first opening may include a through hole completely surrounded by the second heat dissipation layer in a plan view.

The heat dissipation substrate may be disposed in the first opening directly contacting an inner wall of the first opening of the second heat dissipation layer.

The second heat dissipation layer may further include a plurality of sub-heat dissipation patterns separated from the main heat dissipation pattern having a linear shape extending in one direction, the second heat dissipation layer may further include a second opening formed completely through the second heat dissipation layer in a thickness direction, and a plurality of such second openings may be disposed between the sub-heat dissipation patterns and between the main heat dissipation pattern and the sub-heat dissipation pattern in the plan view.

The sub-heat dissipation patterns may be located in the bending area.

According to one or more exemplary embodiments of the invention, a display includes: a display panel; and a panel bottom sheet disposed below the display panel, the panel bottom sheet including: a first heat dissipation layer; a second heat dissipation layer including side surfaces located further inside than side surfaces of the first heat dissipation layer; a heat dissipation substrate disposed directly on the second heat dissipation layer; and a buffering member disposed between the heat dissipation substrate and the display panel, the buffering member having a thickness of 120 μm to 180 μm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
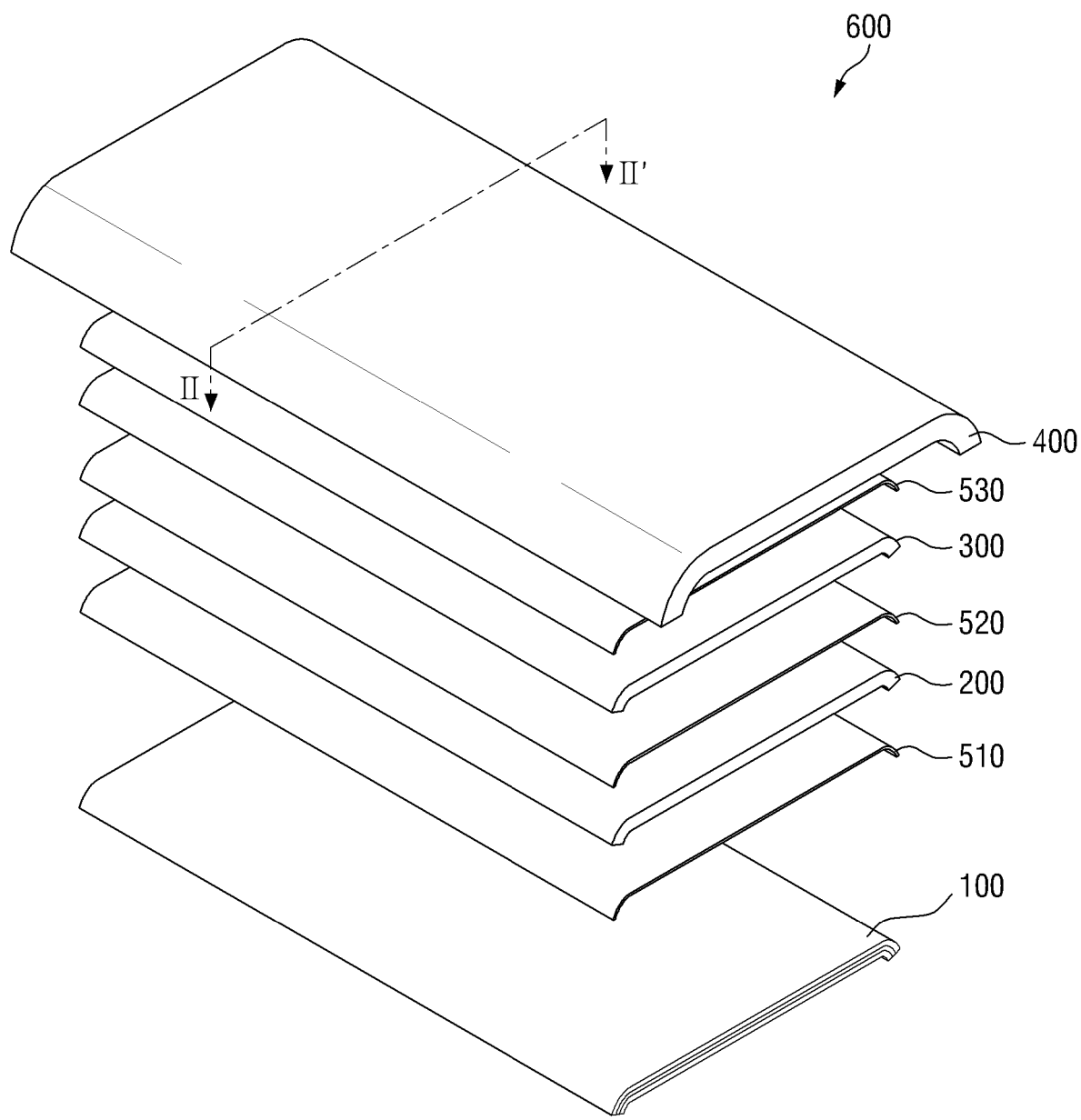
FIG. 1 is an exploded perspective view of a display according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order.

For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Advantages and features of the present disclosure and a method of achieving the same will become apparent with reference to the attached drawings and embodiments described below in detail. However, the present disclosure is not limited to the exemplary embodiments described below and may be embodied with a variety of different modifications. The exemplary embodiments are merely provided to allow one of ordinary skill in the art to completely understand the scope of the present disclosure, and the present disclosure is defined by only the scope of the claims.

Hereinafter, embodiments will be described with reference to the attached drawings.

Figure 2:
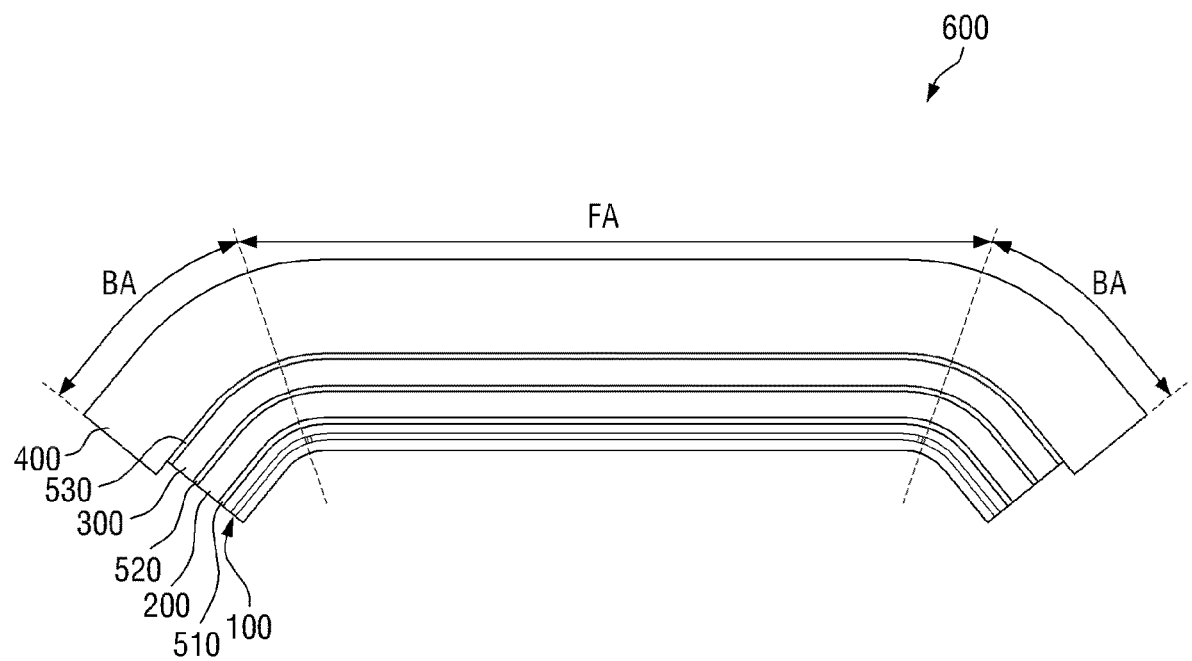
FIG. 2 is a cross-sectional view taken along a sectional line II-II' of FIG. 1.

FIG. 1 is an exploded perspective view of a display according to an exemplary embodiment. FIG. 2 is a cross-sectional view taken along a sectional line II-II' of FIG. 1.

Referring to FIGS. 1 and 2, a display 600 includes a display panel 200 and a panel bottom sheet 100 disposed below the display panel 200. The display 600 may further include a window 400 disposed above the display panel 200. In the specification, unless defined otherwise, "above," "top," and "top surface" mean a display surface side on the basis of the display panel 200, and "below," "bottom," and "bottom surface" mean an opposite side of a display surface on the basis of the display panel 200.

The display 600 may have a rectangular shape in a plan view. The display 600 may include both long sides and both short sides. A corner at which the long side and the short side of the display 600 meet each other may be rectangular but may form a curved surface as shown in FIG. 1. A planar shape of the display 600 is not limited thereto, and a circular shape or other shapes may be applied thereto.

The display panel 200 is a panel which displays a screen, and for example, an organic light emitting display panel may be applied thereto. Although the display panel 200 to which an organic light emitting display panel is applied is exemplified in the following embodiment, the disclosure is not limited thereto, and other types of display panels such as a liquid crystal display, an electro phoretic image display, and the like may be applied thereto.

The display panel 200 includes a plurality of organic light emitting diodes (OLED) arranged on a substrate. The substrate may be a rigid substrate formed of glass and the like or may be a flexible substrate formed of polyimide and the like. When a polyimide substrate is applied to the substrate, the display panel 200 may be curved, bent, folded, or rolled.

The window 400 is disposed above the display panel 200. The window 400 is disposed above the display panel 200 to protect the display panel 200 while transmitting light emitted from the display panel 200. The window 400 may be formed of glass and the like.

The window 400 may be disposed to be overlapped with the display panel 200 and to cover an entire surface of the display panel 200. The window 400 may be larger than the display panel 200. For example, the window 400 may protrude outward further than the display panel 200 at both short sides of the display 600.

In an exemplary embodiment, a touch member 300 may be disposed between the display panel 200 and the window 400. The touch member 300 may be a panel type touch member or a film type touch member. The touch member 300 may have a size substantially equal to that of the display panel 200 and be overlapped therewith such that circumferential side surfaces of the touch member 300 and circumferential side surfaces of the display panel 200 may be aligned but are not limited thereto. The display panel 200 may be coupled with the touch member 300 and the touch member 300 may be coupled with the window 400 by transparent coupling layers 520 and 530 such as an optically clear adhesive (OCA), an optically clear resin (OCR), and the like. The touch member 300 may be omitted. In this case, the display panel 200 and the window 400 may be coupled with each other by the OCA, the OCR, or the like. In some embodiments, the display panel 200 may include a touch electrode portion therein.

The panel bottom sheet 100 is disposed below the display panel 200. A panel sheet coupling layer 510 may be disposed between the panel bottom sheet 100 and the display panel 200. The panel bottom sheet 100 may be attached to a bottom of the display panel 200 through the panel sheet coupling layer 510. In the exemplary embodiment, the panel sheet coupling layer 510 is provided as an additional member separate from the panel bottom sheet 100. However, the panel sheet coupling layer 510 may be included as a top coupling layer in the panel bottom sheet 100. A material of the panel sheet coupling layer 510 may be selected from exemplary materials of first and second coupling layers 22 and 23 which will be described below.

The panel bottom sheet 100 may have a size substantially equal to that of the display panel 200 and be overlapped therewith such that circumferential side surfaces of the panel bottom sheet 100 and circumferential side surfaces of the display panel 200 may be aligned but are not limited thereto. The panel bottom sheet 100 may perform a heat dissipation function, an electromagnetic wave blocking function, a grounding function, a buffering function, a reinforcing function, a digitizing function, and/or the like. The panel bottom sheet 100 may be described below in detail.

In an exemplary embodiment, the display 600 may include a flat area FA and a bending area BA connected to the flat area FA and located on a periphery of the flat area FA. The flat area FA is generally located in one plan view. The bending area BA is not disposed in the same plane as the flat area FA. For example, the bending area BA may be bent or curved downward from the plane in which the flat area FA is located.

In an exemplary embodiment, the bending area BA may include a curved surface which is convexly curved outward. In another exemplary embodiment, the bending area BA may have a flat surface while being located in a plane in which the flat surface of the bending area BA meets a flat surface of the flat area FA at a certain angle.

The bending area BA may be located at both long sides or at one long side of the display 600 including a rectangular shape. Although not shown in the drawings, the short sides of the display 600 may be bent.

All of the display panel 200, the touch member 300, the window 400, and the panel bottom sheet 100 may be located over the flat area FA and the bending area BA.

Unlike that shown in the drawings, the display may be a flat display including only the flat area without the bending area. Contents disclosed in the specification, except content particularly related to the bending area, may be equally applied to not only a bent display but also a flat display.

Hereinafter, the above-described panel bottom sheet 100 will be described in detail.

Figure 3:
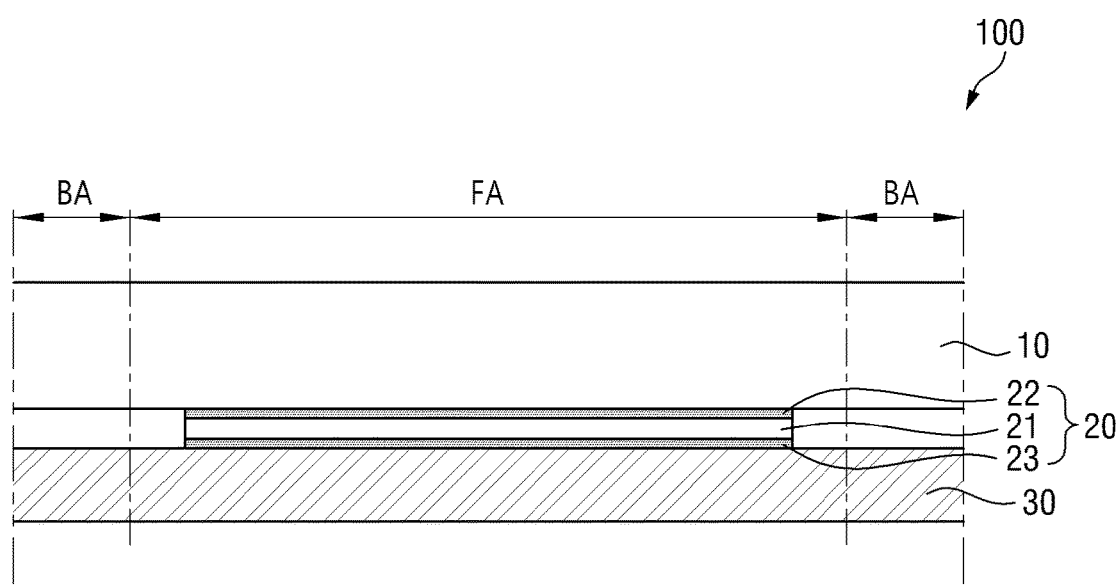
FIG. 3 is a schematic cross-sectional view of a panel bottom sheet according to an exemplary embodiment.
Figure 4:
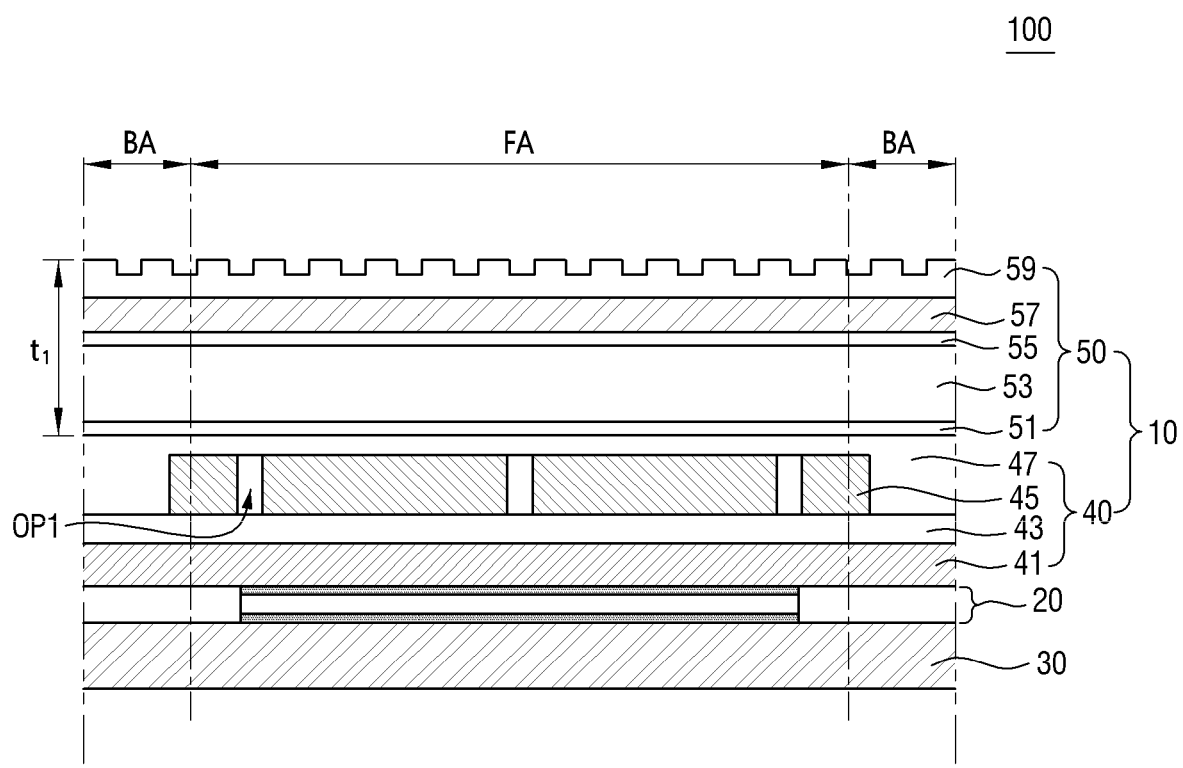
FIG. 4 is a detailed cross-sectional view of the panel bottom sheet according to an exemplary embodiment.
Figure 5:
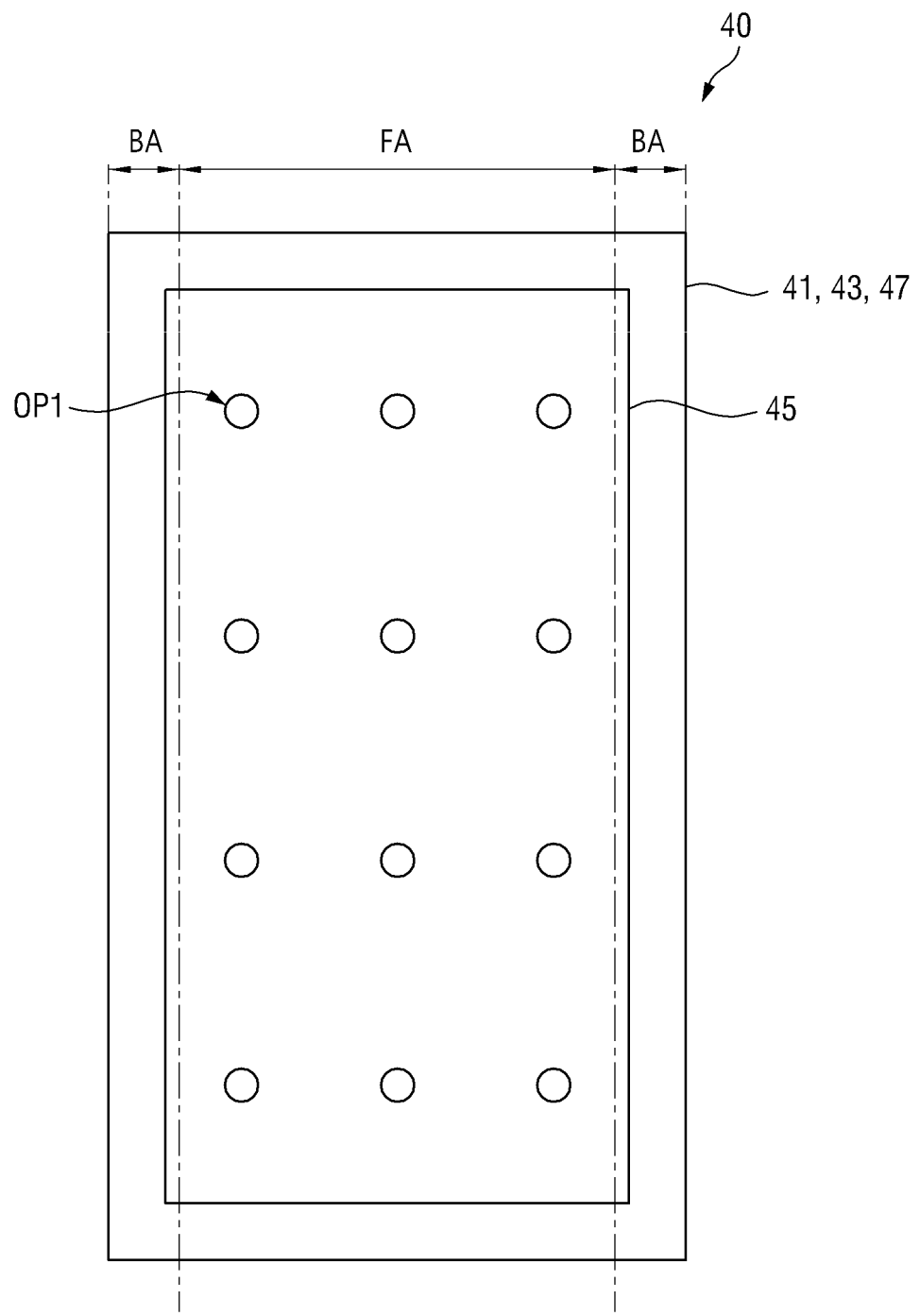
FIG. 5 is an arrangement plan view of a heat dissipation member according to an exemplary embodiment.

FIG. 3 is a schematic cross-sectional view of the panel bottom sheet according to an exemplary embodiment, FIG. 4 is a detailed cross-sectional view of the panel bottom sheet according to an exemplary embodiment, and FIG. 5 is an arrangement plan view of a heat dissipation member according to an exemplary embodiment.

In FIGS. 3, 4, and 5, for convenience of description, a generally flat panel bottom sheet is shown. When the flat panel bottom sheet is attached to the bent display panel 200, they are bent together. In this case, an area divided into the flat area FA and the bending area BA is shown while being divided by a dotted line in FIGS. 3, 4, and 5.

Referring to FIGS. 3, 4, and 5, the panel bottom sheet 100 includes a main sheet 10, a bottom coupling member 20, and a releasing film 30.

The main sheet 10 includes at least one functional layer. The functional layer may be a layer which performs a heat dissipation function, an electromagnetic wave blocking function, a grounding function, a buffering function, a reinforcing function, a supporting function, a digitizing function, and/or the like. The functional layer may be a sheet layer formed of a sheet, a film layer formed of a film, a thin film layer, a coating layer, a panel, a plate, and the like. One functional layer may be formed as a single layer but may be formed of a plurality of stacked thin films or coating layers. The functional layer may be, for example, a member, a heat dissipation layer, an electromagnetic wave blocking layer, a shock-absorbing layer, a digitizer, or the like.

The main sheet 10 may include a plurality of functional layers and a coupling interlayer coupling the same. The respective functional layers may be disposed to be overlapped. The adjacent functional layers may be coupled by the coupling interlayer. The respective functional layers and the coupling interlayer may have the same size in a plan view but are not limited thereto and some or all of the layers may have different sizes. Also, any one of the respective functional layers and the coupling interlayer may further protrude in a particular direction or in all directions relative to other layers. An external planar shape of the main sheet 10 may be defined by connecting maximally protruding parts among the stacked functional layers and the coupling interlayer. Detailed arrangements of the functional layers and the coupling interlayer will be described below.

A bottom coupling member 20 is disposed on a bottom surface of the main sheet 10. The bottom surface of the main sheet 10 may be formed of a single layer but may also be formed of several layers. For example, when a layer located lowermost among the layers is smaller than a layer located thereabove such that a part of the above-located layer is exposed downward to the outside, the bottom surface of the main sheet 10 may include both a bottom surface of the lowermost-located layer and an exposed bottom surface of the above-located layer.

The bottom coupling member 20 is covered and protected by the releasing film 30. However, in assembling of a set, the releasing film 30 may be separated and a surface, that is, a bottom surface of the bottom coupling member 20, may be exposed to the outside. A set bracket (not shown) may be attached to the exposed surface (bottom surface) of the bottom coupling member 20.

In an exemplary embodiment, the bottom coupling member 20 may be formed of double-sided tape as shown in FIGS. 3 and 4. The double-sided tape includes a member 21, the first coupling layer 22 disposed on a bottom surface of the member 21, and the second coupling layer 23 disposed on a top surface of the member 21. The member 21 may include polyethylene terephthalate (PET), polyimide (PI), polycarbonate (PC), polyethylene (PE), polypropylene (PP), polysulfone (PSF), poly(methyl methacrylate) (PMMA), triacetyl cellulose (TAC), cyclo olefin polymer (COP), and the like.

The first and second coupling layers 22 and 23 may include an adhesive layer, a viscous layer, or a resin layer. For example, the first and second coupling layers 22 and 23 may include polymer materials classified into a silicone-based polymer, a urethane-based polymer, an SU polymer including a silicone-urethane hybrid structure, an acryl-based polymer, an isocianate-based polymer, a polyvinyl alcohol-based polymer, a gelatin-based polymer, a vinyl-based polymer, a latex-based polymer, a polyester-based polymer, a water-polyester-based polymer, and the like.

In another exemplary embodiment, the bottom coupling member 20 may include a single viscous layer or adhesive layer. For example, the bottom coupling member 20 may be formed as a single coating layer formed of a material identical or similar to those of the first and second coupling layers 22 and 23.

The bottom coupling member 20 is disposed on a partial area of the bottom surface of the main sheet 10 and exposes other areas of the bottom surface of the main sheet 10. Since the bottom coupling member 20 has a certain thickness, a step may occur between an area in which the bottom coupling member 20 is located and an area in which the bottom coupling member 20 is not located.

The bottom surface of the main sheet 10 may be divided into a cover area in which the bottom coupling member 20 is disposed and an exposed area in which the bottom coupling member 20 is not disposed. In an exemplary embodiment, the bottom coupling member 20 may be smaller than the main sheet 10. The bottom coupling member 20 may be disposed on a central part of the bottom surface of the main sheet 10 and may expose an edge part of the main sheet 10. In this case, the central part of the bottom surface of the main sheet 10 becomes the cover area and a peripheral part adjacent to each side of the bottom surface of the main sheet 10, in other words, an edge part becomes the exposed area.

When the panel bottom sheet 100 is attached to the bent display panel 200, the cover area may be located in the flat area FA and may not be overlapped with the bending area BA. The exposed area located on the long side may be completely overlapped with the bending area BA in a width direction and additionally may extend to a part of the flat area FA.

The releasing film 30 is disposed on the bottom surface of the bottom coupling member 20. The releasing film 30 protects the bottom surface of the bottom coupling member 20. The releasing film 30 may come into contact with the bottom coupling member 20 while not being completely attached thereto to be delaminated during a following process. The releasing film 30 may include PET, PC, PI, paper, or the like. To increase a releasing force of the releasing film 30, a top surface of the releasing film 30 may be treated with a silicone liquid or coated with a releasing layer including a silicone-based resin but is not limited thereto.

The releasing film 30 may cover an entirety of the bottom coupling member 20 while being disposed to the area in which the bottom coupling member 20 is not located. That is, the releasing film 30 may be overlapped with the cover area of the bottom surface of the main sheet 10 and additionally may be overlapped with the exposed area of the bottom surface of the main sheet 10. In an exemplary embodiment, the releasing film 30 may completely cover the bottom surface of the main sheet 10.

The releasing film 30 may include a protruding portion which is not overlapped with the bottom surface of the main sheet 10. The protruding portion may protrude outward from one side surface of the main sheet 10. When the protruding portion protrudes from the main sheet 10, it becomes easy to selectively grip only the releasing film 30 from the panel bottom sheet 100 using a hand, a tool, or the like. Accordingly, it becomes easy to remove the releasing film 30 in a process of attaching the set bracket to the bottom coupling member 20.

As shown in FIG. 4, the main sheet 10 may include a heat dissipation member 40 disposed on the bottom coupling member 20 and a buffering member 50 disposed on the heat dissipation member 40. The heat dissipation member 40 may include a first heat dissipation layer 41 disposed on the bottom coupling member 20 and coupled with the first coupling layer 22 of the bottom coupling member 20, a second heat dissipation layer 45 disposed on the first heat dissipation layer 41, and a heat dissipation substrate 47 disposed on the second heat dissipation layer 45. The heat dissipation member 40 may further include a heat dissipation coupling interlayer 43 which is disposed between the first heat dissipation layer 41 and the second heat dissipation layer 45 and couples the first heat dissipation layer 41 with the second heat dissipation layer 45. In other words, the first heat dissipation layer 41 and the second heat dissipation layer 45 may be coupled with each other by the heat dissipation coupling interlayer 43.

The heat dissipation coupling interlayer 43 may include at least one of the above-described exemplary materials of the first coupling layer 22 of the bottom coupling member 20.

The first heat dissipation layer 41 is located at a lower-most part of the main sheet 10, and a bottom surface of the first heat dissipation layer 41 forms the bottom surface of the main sheet 10. The heat dissipation coupling interlayer 43 may be disposed on a top surface of the first heat dissipation layer 41, the second heat dissipation layer 45 may be disposed on a top surface of the heat dissipation coupling interlayer 43, and the heat dissipation substrate 47 may be disposed on a top surface of the second heat dissipation layer 45.

The first heat dissipation layer 41 may include a metal foil such as copper, silver, and the like. The second heat dissipation layer 45 may include graphite, carbon nanotubes, or the like. Although not shown in the drawing, the first heat dissipation layer 41 and the second heat dissipation layer 45 may prevent or suppress heat generated by a plurality of components disposed below the panel bottom sheet 100, for example, an application chip, a camera, or a battery component from reaching the display panel 200.

The first heat dissipation layer 41 may be disposed over the cover area and the exposed area. The first heat dissipation layer 41 may be disposed over the flat area FA and the bending area BA.

The second heat dissipation layer 45 may be partially disposed over the exposed area and may be disposed over the cover area. The second heat dissipation layer 45 may be disposed in the flat area FA and may be disposed in a part of the bending area BA. In some embodiments, the second heat dissipation layer 45 may not be disposed in the bending area BA. Circumferential side surfaces of the second heat dissipation layer 45 may be located further inside than circumferential side surfaces of the bottom coupling member 20 but are not limited thereto. The second heat dissipation layer 45 may expose an edge part of the heat dissipation coupling interlayer 43.

The second heat dissipation layer 45 includes a first opening OP1. The first opening OP1 may be disposed to be overlapped with the flat area FA of the display 600. A plurality of such first openings OP1 may be provided. Although only three first openings OP1 are shown in the drawing, the present disclosure is not limited thereto and two or four first openings OP1 may be provided.

The first opening OP1 may traverse the first opening OP1 from a top surface (surface) of the second heat dissipation layer 45 in a thickness direction. The first opening OP1 may include a through hole which completely passes through the first opening OP1 from the surface of the second heat dissipation layer 45 in the thickness direction. The second heat dissipation layer 45 includes the through hole so as to be prevented or suppressed from being delaminated from the heat dissipation coupling interlayer 43 in advance.

Referring to FIG. 5, a planar size of the second heat dissipation layer 45 may be smaller than planar sizes of the first heat dissipation layer 41, the heat dissipation coupling interlayer 43, and the heat dissipation substrate 47. For example, the planar size of the second heat dissipation layer 45 is not limited thereto but may be about 60% to about 70% the planar size of the first heat dissipation layer 41.

The plurality of first openings OP1 may be arranged in a plurality of matrix directions. The plurality of first openings OP1 may be arranged to be spaced at certain intervals apart. Although not limited thereto, four first openings OP1 are arranged along a long side direction (column direction) of the second heat dissipation layer 45 and three first openings OP1 are arranged along a short side direction (a row direction) of the second heat dissipation layer 45. However, the present disclosure is not limited thereto, and the plurality of first openings OP1 may be arranged in a zigzag-shape along the long side direction or the short side direction of the second heat dissipation layer 45 or may be arranged randomly.

The second heat dissipation layer 45 according to an exemplary embodiment may include graphite. The graphite may be reduced by coating a releasing film such as PET and the like with grapheme oxide paste and increasing a temperature. The reduced graphite may be crystallized and the releasing film may be removed from the crystallized graphite such that the graphite may be laminated on the heat dissipation coupling interlayer 43.

The second heat dissipation layer 45 according to an exemplary embodiment may not be formed by carbonizing organic insulating materials such as PI and the like and may be formed by being coated with graphene oxide paste itself, reduction, crystallization, and lamination as described above so as to promote a decrease in cost.

The heat dissipation substrate 47 disposed above the second heat dissipation layer 45 may be disposed over the flat area FA and the bending area BA. The heat dissipation substrate 47 may be disposed directly on the second heat dissipation layer 45. Also, the heat dissipation substrate 47 may come into contact with a top surface of the heat dissipation coupling interlayer 43 exposed by the second heat dissipation layer 45. The heat dissipation substrate 47 may come into contact with exposed circumferential side surfaces of the second heat dissipation layer 45.

The heat dissipation substrate 47 may be formed by directly coating the second heat dissipation layer 45. For example, the heat dissipation substrate 47 may include a polyamide-imide compound. The heat dissipation member 40 according to an exemplary embodiment may reduce processing costs and processing time by employing a method of directly coating the second heat dissipation layer 45 with the heat dissipation substrate 47 instead of attaching a heat dissipation substrate such as PI and the like to the second heat dissipation layer 45 using a coupling layer such as an adhesive layer, a viscous layer, a resin layer, and the like.

When polyimide is used as the heat dissipation substrate 47, since it is difficult for polyimide to be dissolved in a solvent, it is necessary to attach polyimide as a film to the second heat dissipation layer 45. On the other hand, when the above-described polyamide-imide is used as the heat dissipation substrate 47, it is easier for polyamide-imide to be dissolved in a solvent in comparison to polyimide such that it may be easy to directly coat the second heat dissipation layer 45 with polyamide-imide. Accordingly, an overall thickness of the heat dissipation member 40 may be reduced such that the thin display 600 may be implemented.

The buffering member 50 according to an exemplary embodiment may include a first buffering coupling interlayer 51 disposed on the heat dissipation substrate 47, a cushion layer 53 disposed on the first buffering coupling interlayer 51, a second buffering coupling interlayer 55 disposed on the cushion layer 53, a buffering substrate 57 disposed on the second buffering coupling interlayer 55, and a top coupling layer 59 disposed on the buffering substrate 57. The above layers of the buffering member 50 may be disposed on an entire surface over the flat area FA and the bending area BA.

The buffering member 50 may have a first thickness t1. The first thickness t1 may be from about 180 μm to about 220 μm.

The first buffering coupling interlayer 51, the second buffering coupling interlayer 55, and the top coupling layer 59 may include the exemplified materials of the first coupling layer 22. The first buffering coupling interlayer 51 may perform a function of coupling the cushion layer 53 with the heat dissipation substrate 47 of the heat dissipation member 40. That is, the cushion layer 53 and the heat dissipation substrate 47 of the heat dissipation member 40 may be coupled with each other by the first buffering coupling interlayer 51.

The second buffering coupling interlayer 55 may perform a function of coupling the cushion layer 53 with the heat dissipation substrate 47 of the buffering substrate 57. That is, the cushion layer 53 and the buffering substrate 57 may be coupled with each other by the second buffering coupling interlayer 55.

Although not shown in the drawing, a releasing film may be further disposed on the top surface of the main sheet 10. Embossed shapes may be formed on a surface of the releasing film. The embossed shapes on the surface of the releasing film are transferred to the top coupling layer 59 adjacent thereto such that a top surface of the top coupling layer 59 may have embossed shapes complementary to a surface shape of the releasing film. When the top coupling layer 59 has the embossed shapes on the top surface thereof as described above, the embossed shapes on the surface function as an air path to reduce bubbles when the panel bottom sheet 100 is attached to a bottom surface of the display panel 200. When the top coupling layer 59 is completely attached to the bottom of the display panel 200, the embossed shapes on the top surface of the top coupling layer 59 may collapse to be flat.

The embossed shapes of the releasing film and the embossed shapes of the top coupling layer 59 disposed to be adjacent thereto in the exemplary embodiment may be equally applied to a releasing film or a bottom coupling member 20 in another exemplary embodiment.

The cushion layer 53 performs a function of preventing or protect the display 600 from being damaged by absorbing an external impact. The cushion layer 53 may include a single layer or a plurality of stacked films. The cushion layer 53 may include, for example, an elastic material such as polyurethane, polyethylene resin, and the like.

The buffering substrate 57 may be disposed between the second buffering coupling interlayer 55 and the top coupling layer 59. The buffering substrate 57 may include at least one of PET, PI, PC, PE, PP, PSF, PMMA, TAC, COP, and the like.

Hereinafter, other exemplary embodiments will be described. In the following embodiments, descriptions of components identical to those of the above-described embodiment will be omitted or simplified and differences therebetween will be mainly described.

Figure 6:
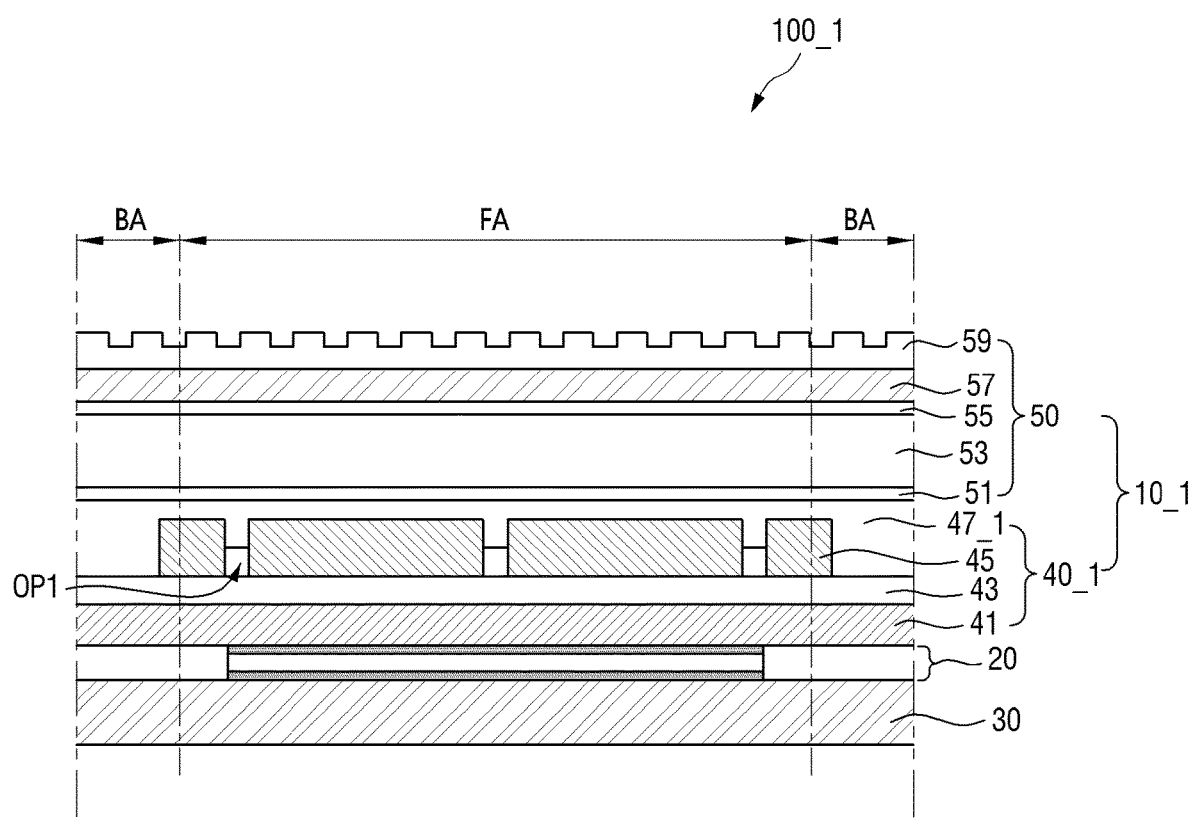
FIG. 6 is a detailed cross-sectional view of a panel bottom sheet according to another exemplary embodiment.

FIG. 6 is a detailed cross-sectional view of a panel bottom sheet according to another exemplary embodiment.

Referring to FIG. 6, a panel bottom sheet 100_1 according to the exemplary embodiment is different from the panel bottom sheet 100 of FIG. 4 in that a heat dissipation substrate 47_1 may be disposed inward to the first opening OP1. A main sheet 10_1 may include the buffering member 50 and a heat dissipation member 40_1.

In more detail, in the panel bottom sheet 100_1 according to the exemplary embodiment, the heat dissipation substrate 47_1 may be disposed inward to the first opening OP1. The heat dissipation substrate 47_1 of the panel bottom sheet 100_1 may come into contact with a part of an inner wall of the second heat dissipation layer 45 in the first opening OP1. The heat dissipation substrate 47_1 may come into a top end of the inner wall of the second heat dissipation layer 45 in the first opening OP1 and may expose a bottom end of the inner wall.

Even in the exemplary embodiment, the heat dissipation member 40_1 may reduce processing costs and processing time by employing a method of directly coating the second heat dissipation layer 45 with the heat dissipation substrate 47_1 instead of attaching a heat dissipation substrate such as PI and the like to the second heat dissipation layer 45 using a coupling layer such as an adhesive layer, a viscous layer, a resin layer, and the like.

In addition, an overall thickness of the heat dissipation member 40_1 may be reduced by employing the coating method such that a thin display may be implemented.

Figure 7:
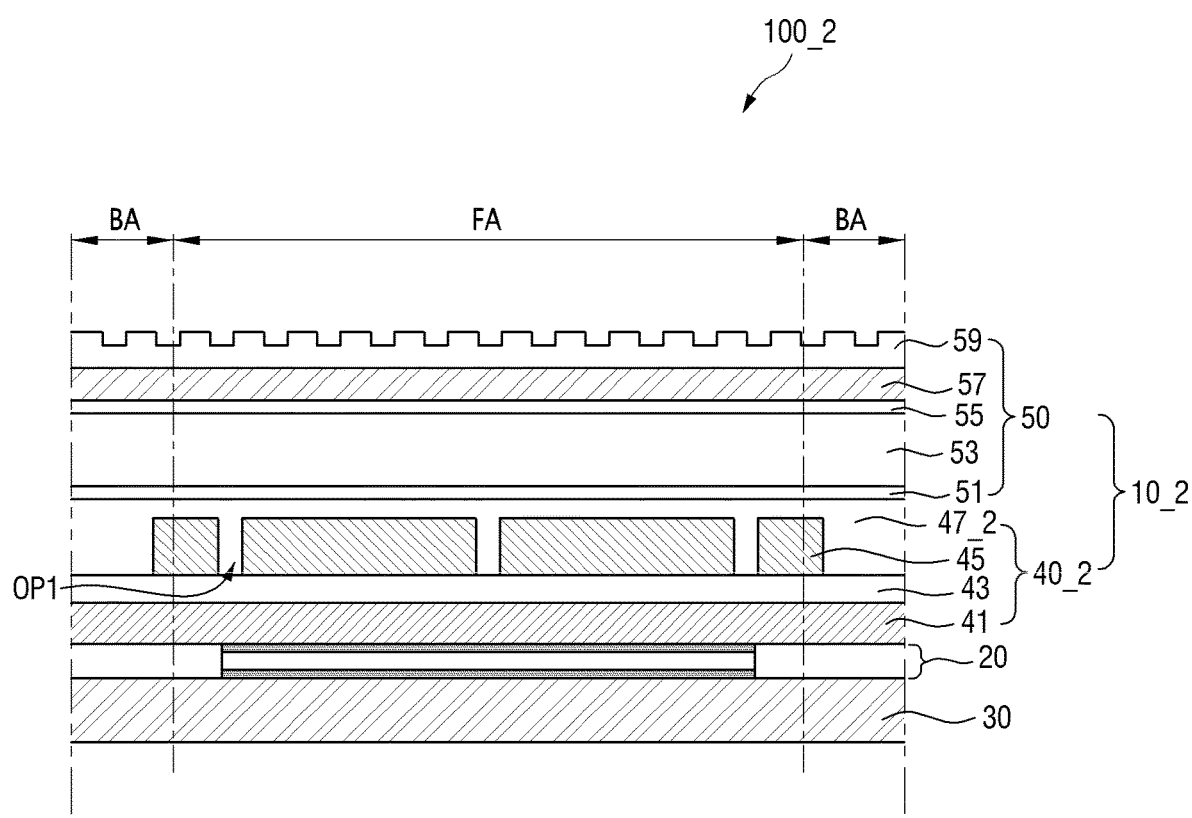
FIG. 7 is a detailed cross-sectional view of a panel bottom sheet according to another exemplary embodiment.

FIG. 7 is a detailed cross-sectional view of a panel bottom sheet according to another exemplary embodiment.

Referring to FIG. 7, a panel bottom sheet 100_2 according to the exemplary embodiment is different from panel bottom sheet 100_1 in that a heat dissipation substrate 47_2 is disposed in the first opening OP1 and comes into contact with an entirety of the inner wall of the second heat dissipation layer 45 in the first opening OP1. The main sheet 10_2 may include the buffering member 50 and a heat dissipation member 40_2.

In more detail, in the panel bottom sheet 100_2 according to the exemplary embodiment, the heat dissipation substrate 47_2 may be disposed in the first opening OP1 and may come into contact with the entirety of the inner wall of the second heat dissipation layer 45 in the first opening OP1.

The heat dissipation substrate 47_2 may come into contact with the top surface of the heat dissipation coupling interlayer 43 therebelow in the first opening OP1.

Even in the exemplary embodiment, the heat dissipation member 40_2 may reduce processing costs and processing time by employing a method of directly coating the second heat dissipation layer 45 with the heat dissipation substrate 47_2 instead of attaching a heat dissipation substrate such as PI and the like to the second heat dissipation layer 45 using a coupling layer such as an adhesive layer, a viscous layer, a resin layer, and the like.

In addition, an overall thickness of the heat dissipation member 40_2 may be reduced by employing the coating method such that a thin display may be implemented.

Figure 8:
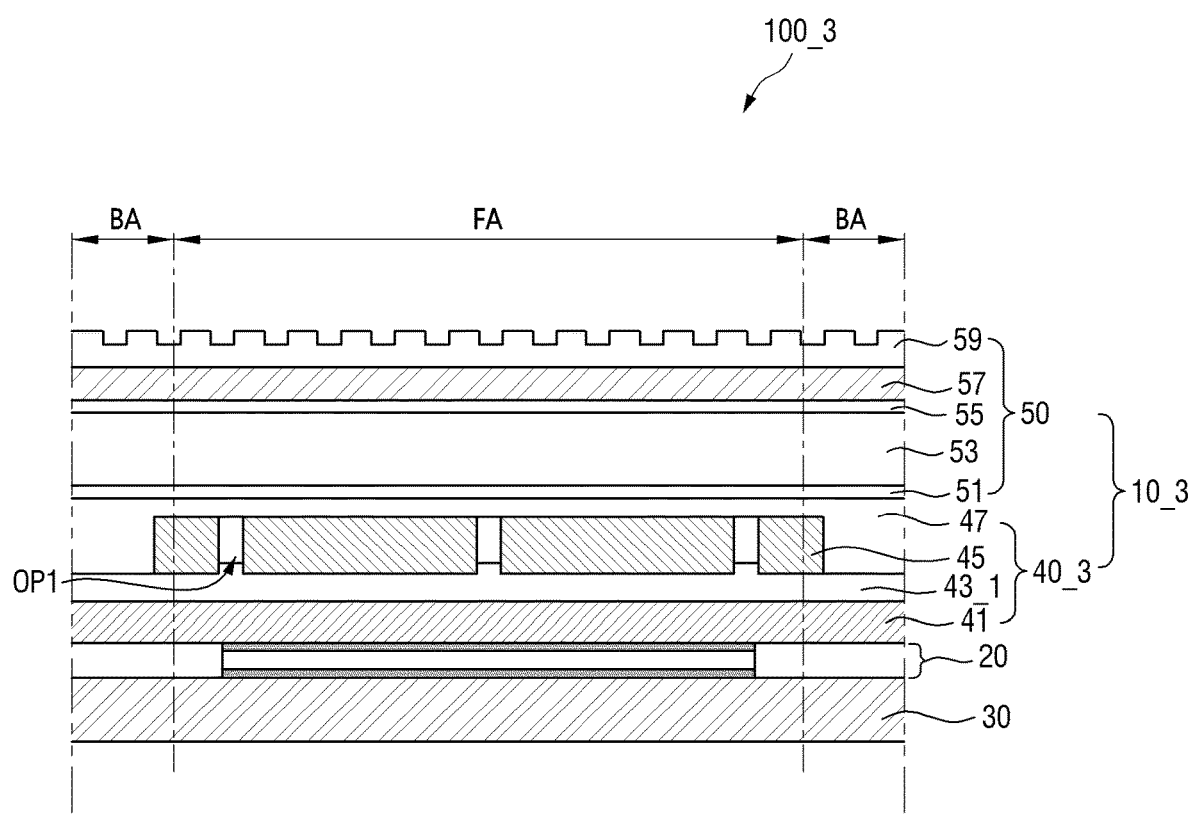
FIG. 8 is a detailed cross-sectional view of a panel bottom sheet according to another exemplary embodiment.

FIG. 8 is a detailed cross-sectional view of a panel bottom sheet according to another exemplary embodiment.

Referring to FIG. 8, a panel bottom sheet 100_3 according to the exemplary embodiment is different from the panel bottom sheet 100 of FIG. 4 in that a heat dissipation coupling interlayer 43_1 may be disposed inward to the first opening OP1. A main sheet 10_3 may include the buffering member 50 and a heat dissipation member 40_3.

In more detail, in the panel bottom sheet 100_3 according to the exemplary embodiment, the heat dissipation coupling interlayer 43_1 may be disposed inward to the first opening OP1. The heat dissipation coupling interlayer 43_1 may come into contact with the inner wall of the second heat dissipation layer 45 in the first opening OP1. The heat dissipation coupling interlayer 43_1 may come into contact with a bottom end of the inner wall of the second heat dissipation layer 45 in the first opening OP1 and may expose a top end of the inner wall.

Even in the exemplary embodiment, the heat dissipation member 40_3 may reduce processing costs and processing time by employing a method of directly coating the second heat dissipation layer 45 with the heat dissipation substrate 47 instead of attaching a heat dissipation substrate such as PI and the like to the second heat dissipation layer 45 using a coupling layer such as an adhesive layer, a viscous layer, a resin layer, and the like.

In addition, an overall thickness of the heat dissipation member 40_3 may be reduced by employing the coating method such that a thin display may be implemented.

Figure 9:
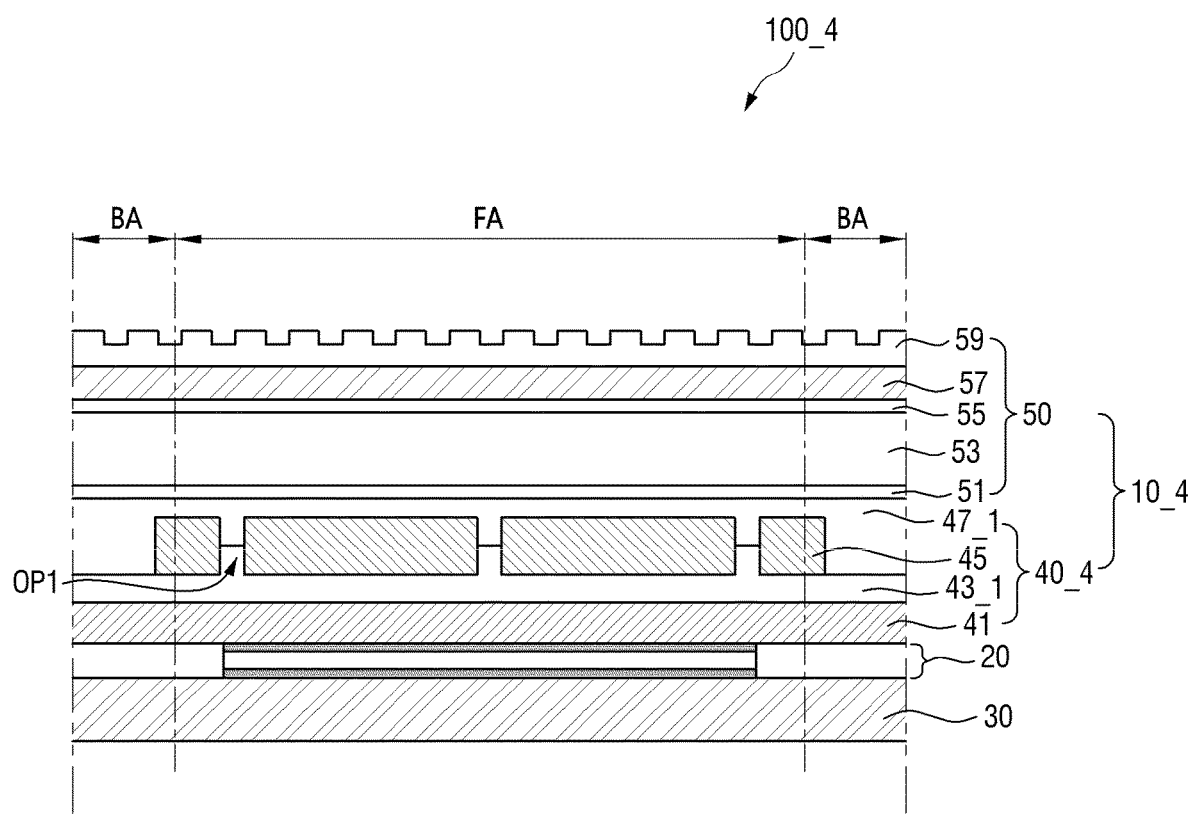
FIG. 9 is a detailed cross-sectional view of a panel bottom sheet according to another exemplary embodiment.

FIG. 9 is a detailed cross-sectional view of a panel bottom sheet according to another exemplary embodiment.

Referring to FIG. 9, a panel bottom sheet 100_4 according to the exemplary embodiment is different from the panel bottom sheet 100 of FIG. 4 in that the heat dissipation substrate 47_1 of FIG. 6 and the heat dissipation coupling interlayer 43_1 of FIG. 8 are applied. A main sheet 10_4 may include the buffering member 50 and a heat dissipation member 40_4.

In the heat dissipation member 40_4 of the panel bottom sheet 100_4 according to the exemplary embodiment, the heat dissipation substrate 47_1 may come into direct contact with the heat dissipation coupling interlayer 43_1 in the first opening OP1.

Even in the exemplary embodiment, the heat dissipation member 40_4 may reduce processing costs and processing time by employing a method of directly coating the second heat dissipation layer 45 with the heat dissipation substrate 47_1 instead of attaching a heat dissipation substrate such as PI and the like to the second heat dissipation layer 45 using a coupling layer such as an adhesive layer, a viscous layer, a resin layer, and the like.

In addition, an overall thickness of the heat dissipation member 40_4 may be reduced by employing the coating method such that a thin display may be implemented.

Figure 10:
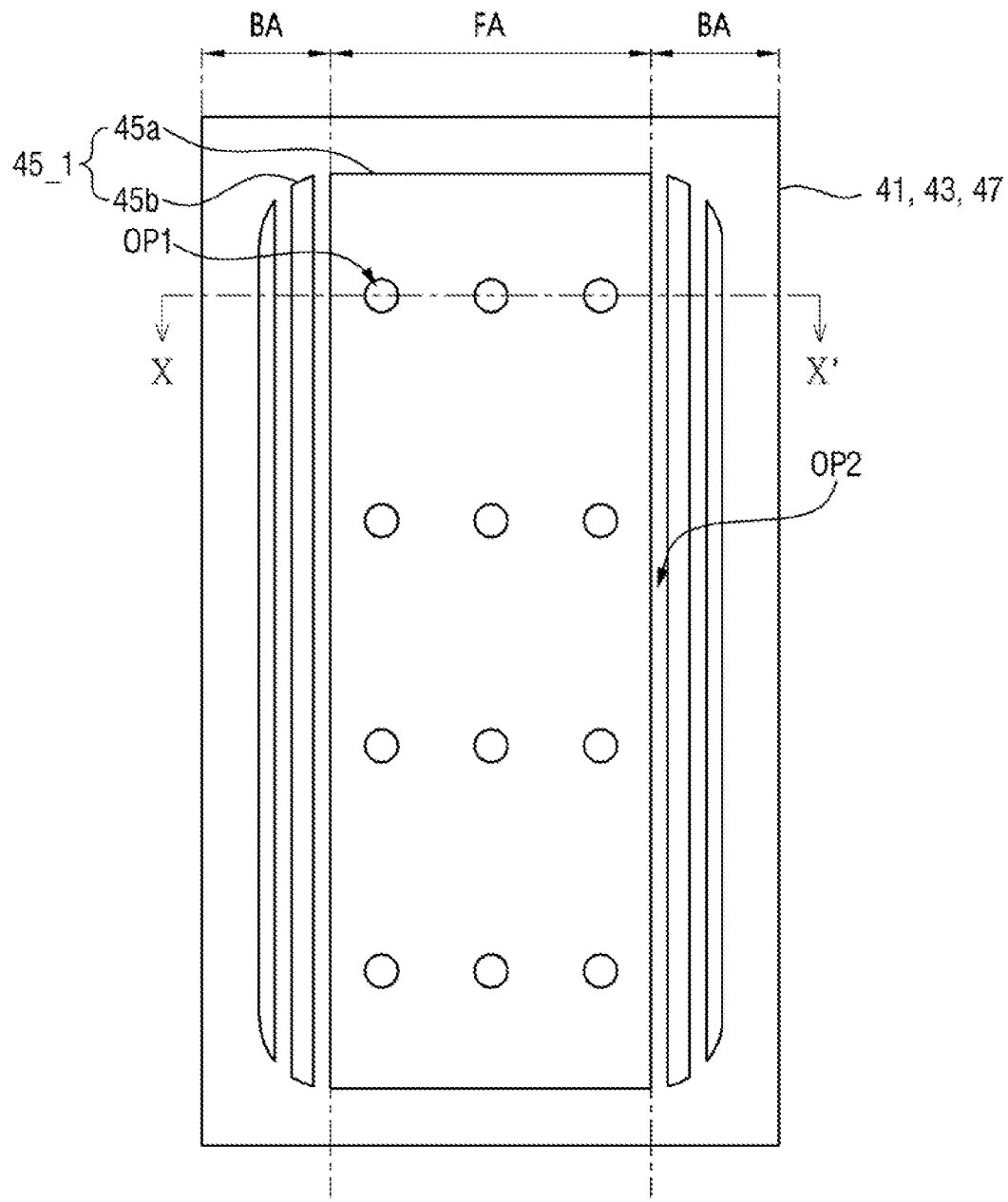
FIG. 10 is an arrangement plan view of a heat dissipation member according to another exemplary embodiment.
Figure 11:
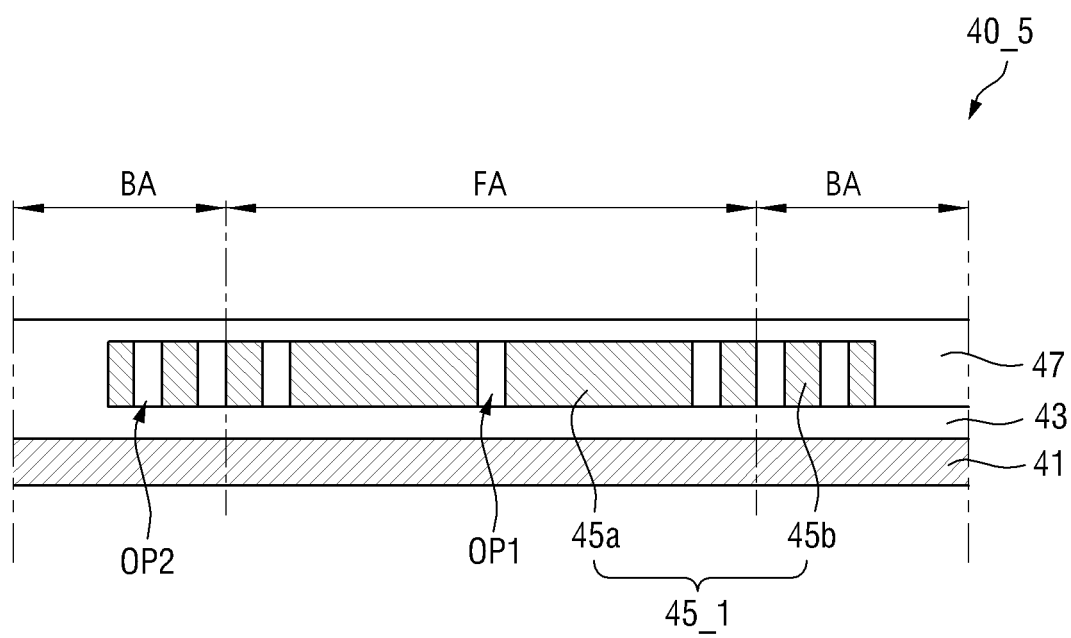
FIG. 11 is a cross-sectional view taken along a sectional line X-X' of FIG. 10.
Figure 12:
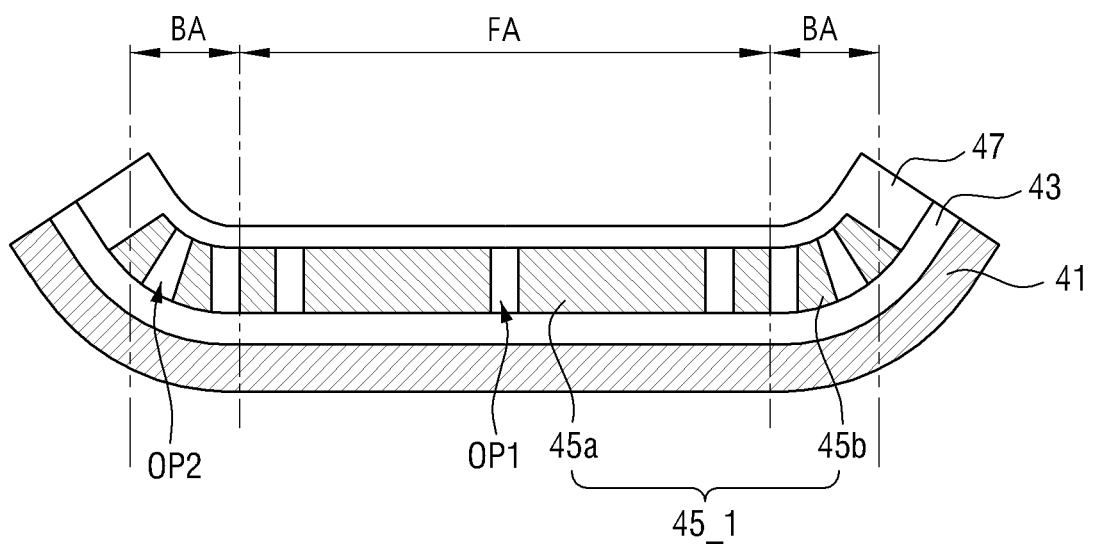
FIG. 12 is a cross-sectional view illustrating the heat dissipation member being bent according to another exemplary embodiment.

FIG. 10 is an arrangement plan view of a heat dissipation member according to another exemplary embodiment, FIG. 11 is a cross-sectional view taken along a sectional line X-X' in FIG. 10, and FIG. 12 is a cross-sectional view illustrating the heat dissipation member being bent according to another exemplary embodiment.

Referring to FIGS. 10, 11, and 12, a heat dissipation member 40_5 according to the exemplary embodiment is different from the heat dissipation member 40 of FIGS. 4 and 5 in that a second heat dissipation layer 45_1 thereof includes a main heat dissipation pattern 45a generally disposed in the flat area FA and a sub-heat dissipation pattern 45b disposed in the bending area BA.

Since the main heat dissipation pattern 45a of FIGS. 10, 11, and 12 is substantially identical to the second heat dissipation layer 45 described above with reference to FIGS. 4 and 5, a repetitive description will be omitted below.

The sub-heat dissipation pattern 45b may be disposed in the bending area BA of the display 600. The sub-heat dissipation pattern 45b may be disposed while being spaced apart from the main heat dissipation pattern 45a. The sub-heat dissipation pattern 45b may be disposed while being spaced apart from the main heat dissipation pattern 45a with a second opening OP2 being interposed therebetween. The second opening OP2 may have a shape extending along the first heat dissipation layer 41 and a long side direction of the main heat dissipation pattern 45a of the second heat dissipation layer 45_1. The second opening OP2 may include a through hole which completely passes through the second heat dissipation layer 45_1 from a surface or a top surface of the second heat dissipation layer 45_1 in a thickness direction. The second opening OP2 may completely separate the sub-heat dissipation pattern 45b and the main heat dissipation pattern 45a, which are adjacent to each other, from each other. The second opening OP2 may be disposed between the adjacent sub-heat dissipation patterns 45b.

The sub-heat dissipation pattern 45b may have a linear shape extending along the first heat dissipation layer 41 and a long side direction of the main heat dissipation pattern 45a of the second heat dissipation layer 45_1.

In the heat dissipation member 40_5 according to the exemplary embodiment, the second heat dissipation layer 45_1 is disposed to further extend to the bending area BA such that a heat dissipation function of the second heat dissipation layer 45_1 may be more easily performed.

In addition, as shown in FIG. 12, since the second openings OP2 are disposed between the main heat dissipation patterns 45a and the sub-heat dissipation pattern 45b, which are adjacent to each other, and between the adjacent sub-heat dissipation patterns 45b, even when the panel bottom sheet is attached to the display and bent in a bending direction, flexibility in the bending direction is secured so as to not only reduce bending stress but also prevent or suppress delamination between upper and lower structures of the second heat dissipation layer 45_1 also in the bending area BA.

Also, when the display is bent, the adjacent sub-heat dissipation patterns 45b and the sub-heat dissipation pattern 45b and the main heat dissipation pattern 45a, which are adjacent to each other, may come into contact with each other. Accordingly, a heat dissipation function of the second heat dissipation layer 45_1 may be provided effectively.

Figure 13:
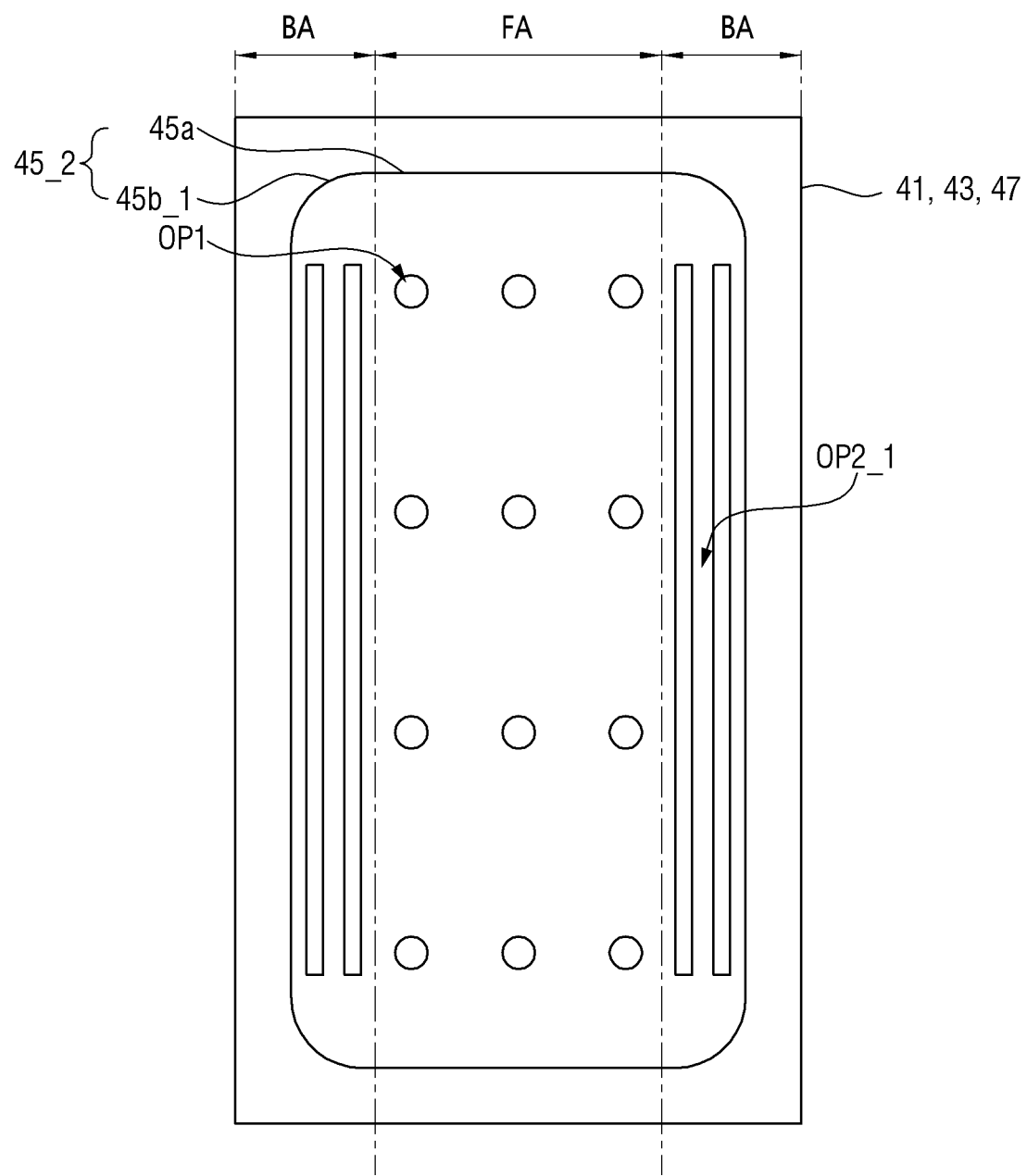
FIG. 13 is an arrangement plan view of a heat dissipation member according to another exemplary embodiment.

FIG. 13 is an arrangement plan view of a heat dissipation member according to another exemplary embodiment.

Referring to FIG. 13, a heat dissipation member 40_6 according to the exemplary embodiment is different from the heat dissipation member 40_5 of FIGS. 10, 11, and 12 in that the main heat dissipation pattern 45a and a sub-heat dissipation pattern 45b_1 are physically connected to each other.

In more detail, in the heat dissipation member 40_6 according to the exemplary embodiment, the main heat dissipation pattern 45a and the sub-heat dissipation pattern 45b_1 of a second heat dissipation layer 45_2 are physically connected to each other. A second opening OP2_1 may be completely surrounded by the main heat dissipation pattern 45a and the sub-heat dissipation pattern 45b_1 in a plan view.

In the heat dissipation member 40_6 according to the exemplary embodiment, the second heat dissipation layer 45_2 is disposed to further extend to the bending area BA such that a heat dissipation function of the second heat dissipation layer 45_2 may be performed more easily.

In addition, since the second openings OP2_1 are disposed between the main heat dissipation patterns 45a and the sub-heat dissipation pattern 45b_1, which are adjacent to each other, and between the adjacent sub-heat dissipation patterns 45b_1, even when the panel bottom sheet is attached to the display and bent in a bending direction, flexibility in the bending direction is secured so as to not only reduce bending stress but also prevent or suppress delamination between upper and lower structures of the second heat dissipation layer 45_2 also in the bending area BA.

Figure 14:
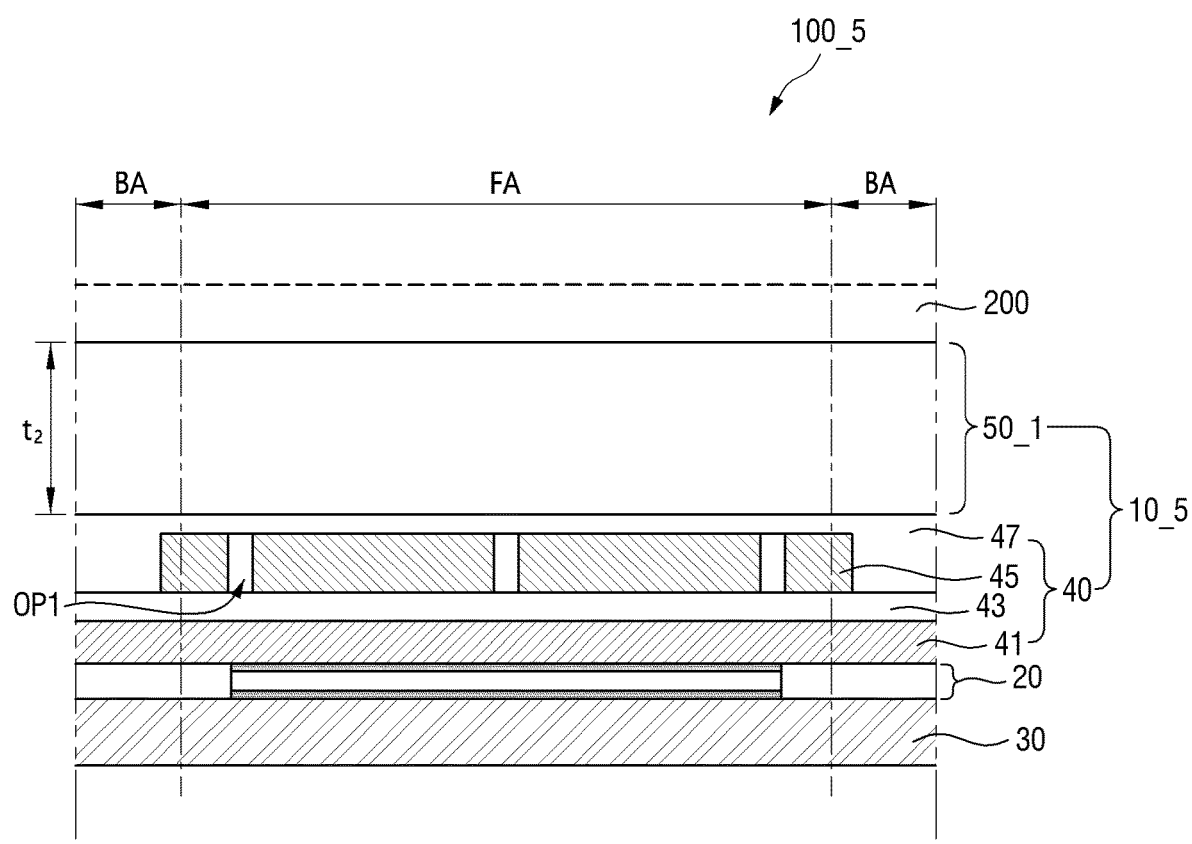
FIG. 14 is a detailed cross-sectional view of a panel bottom sheet according to another exemplary embodiment.

FIG. 14 is a detailed cross-sectional view of a panel bottom sheet according to another exemplary embodiment.

Referring to FIG. 14, a panel bottom sheet 100_5 according to the exemplary embodiment is different from the panel bottom sheet 100 of FIG. 4 in that a buffering member 50_1 does not include layers distinguished from each other and is formed as a single component. A main sheet 10_5 may include the buffering member 50_1 and the heat dissipation member 40.

In more detail, in the panel bottom sheet 100_5 according to the exemplary embodiment, the buffering member 50_1 does not include layers distinguished from each other and may be formed as a single component.

The buffering member 50_1 may be formed as an adhesive layer, a viscous layer, a resin layer, or the like. In the exemplary embodiment, the buffering member 50_1 may include a pressure sensitive adhesive (PSA). For example, the buffering member 50_1 may include an impact-resistant pressure-sensitive adhesive. The impact-resistant pressure-sensitive adhesive may include the PSA and a material including a damping property maximized in a high-frequency band (1,000 to 10,000 Hz).

A second thickness t2 of the buffering member 50_1 according to the exemplary embodiment may be smaller than the first thickness t1 of the buffering member 50 of FIG. 4. For example, the second thickness t2 may be from about 120 μm to about 170 μm.

The buffering member 50_1 may come into direct contact with the display panel 200 thereabove and the heat dissipation substrate 47 of the heat dissipation member 40 therebelow. In the panel bottom sheet 100_5 according to the exemplary embodiment, the buffering member 50_1 does not include components distinguished from each other and is formed as one layer so as to reduce an overall thickness of the display.

Figure 15:
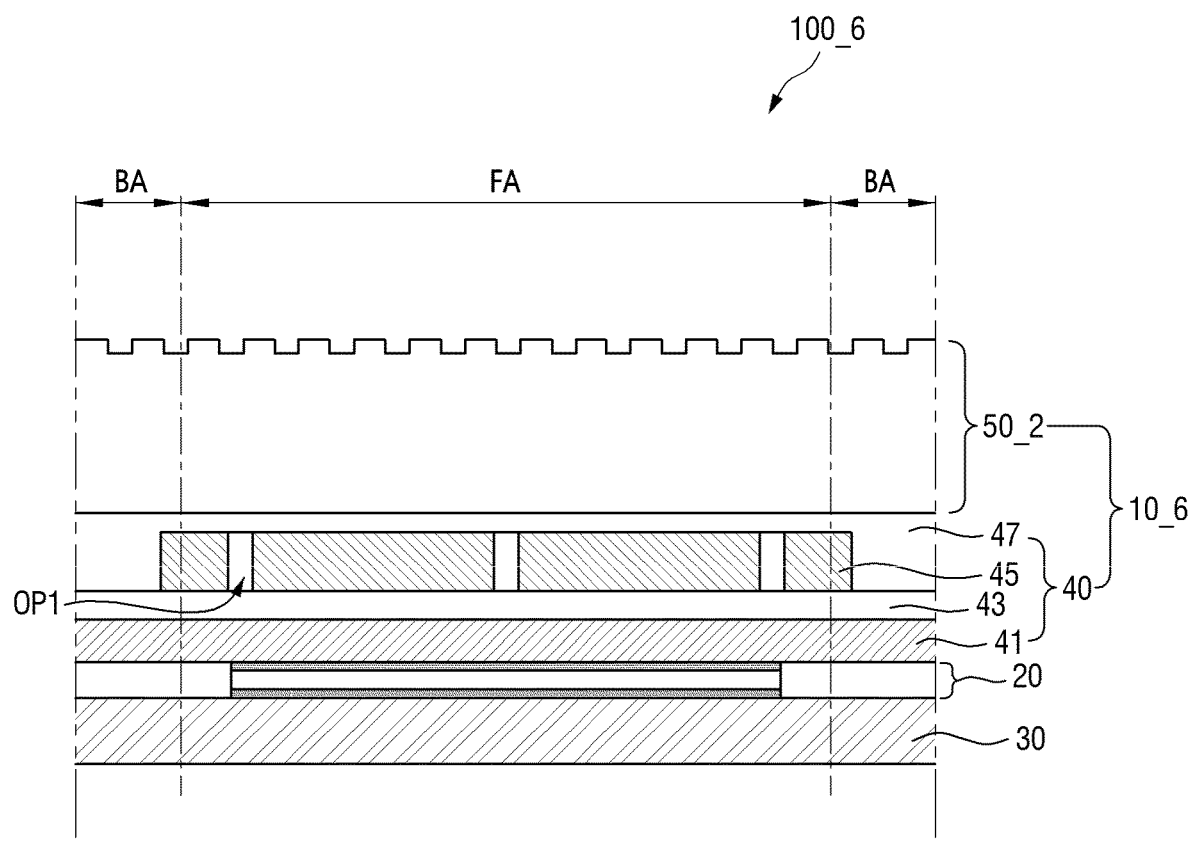
FIG. 15 is a detailed cross-sectional view of a panel bottom sheet according to another exemplary embodiment.

FIG. 15 is a detailed cross-sectional view of a panel bottom sheet according to another exemplary embodiment.

Referring to FIG. 15, a panel bottom sheet 100_6 according to the exemplary embodiment is different from the panel bottom sheet 100_5 of FIG. 14 in that the panel bottom sheet 100_6 further includes embossed shapes on a top surface of a buffering member 50_2. A main sheet 10_6 may include the buffering member 50_2 and the heat dissipation member 40.

In more detail, the panel bottom sheet 100_6 according to the exemplary embodiment may further include embossed shapes on the top surface of the buffering member 50_2. Since the embossed shapes have been described above with reference to FIG. 4, a repetitive description will be omitted below.

Figure 16:
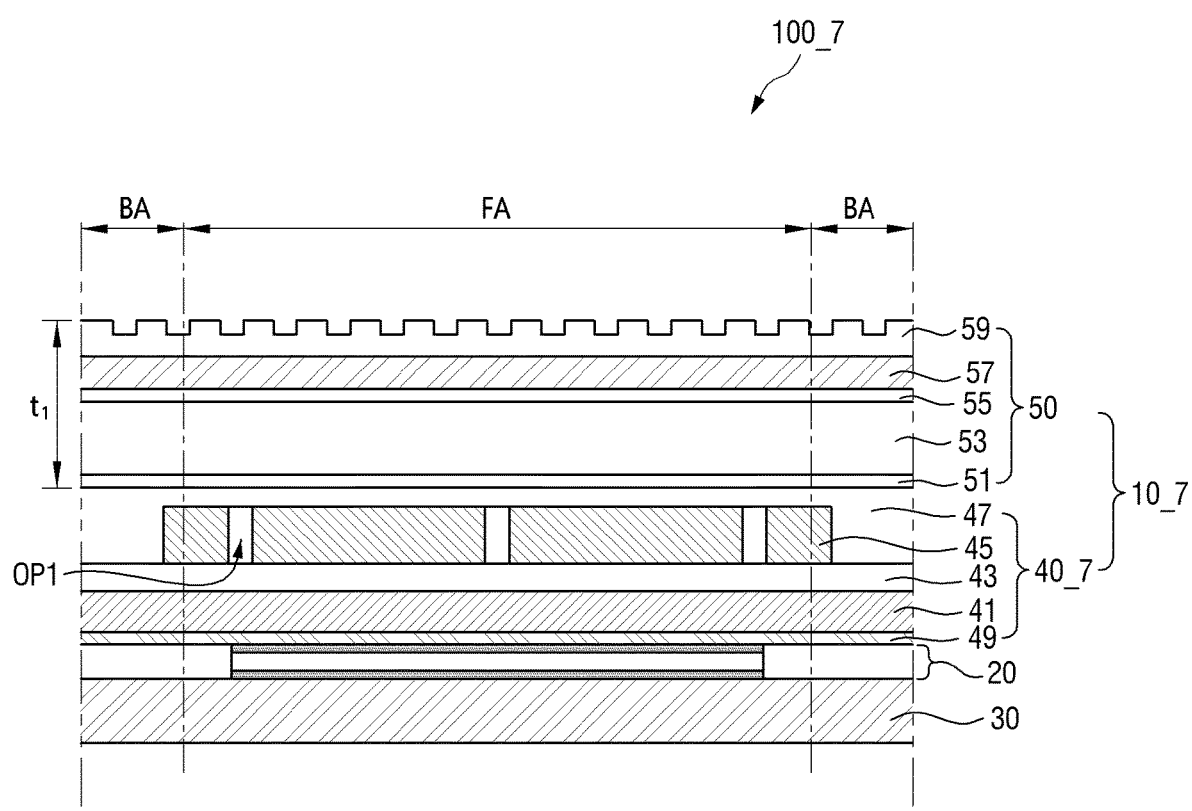
FIG. 16 is a detailed cross-sectional view of a panel bottom sheet according to another exemplary embodiment.

FIG. 16 is a detailed cross-sectional view of a panel bottom sheet according to another exemplary embodiment.

Referring to FIG. 16, a panel bottom sheet 100_7 according to the exemplary embodiment is different from the panel bottom sheet 100 according to an exemplary embodiment in that a heat dissipation member 40_7 further includes a heat dissipation paint 49 disposed below the first heat dissipation layer 41. A main sheet 10_7 may include the heat dissipation member 40_7 and the buffering member 50.

In more detail, in the panel bottom sheet 100_7 according to the exemplary embodiment, the heat dissipation member 40_7 may further include the heat dissipation paint 49 disposed below the first heat dissipation layer 41.

The heat dissipation paint 49 may include a metallic oxide. For example, the metallic oxide may be one of aluminum oxide, zinc oxide, or zirconium oxide.

The heat dissipation paint 49 may be disposed between the first heat dissipation layer 41 and the bottom coupling member 20. The heat dissipation paint 49 may be disposed directly on a bottom surface of the first heat dissipation layer 41. The heat dissipation paint 49 may be disposed on the bottom surface of the first heat dissipation layer 41 so as to more easily prevent or suppress heat of set components, which diffuses in a lower direction, from diffusing toward the display panel 200.

Figure 17:
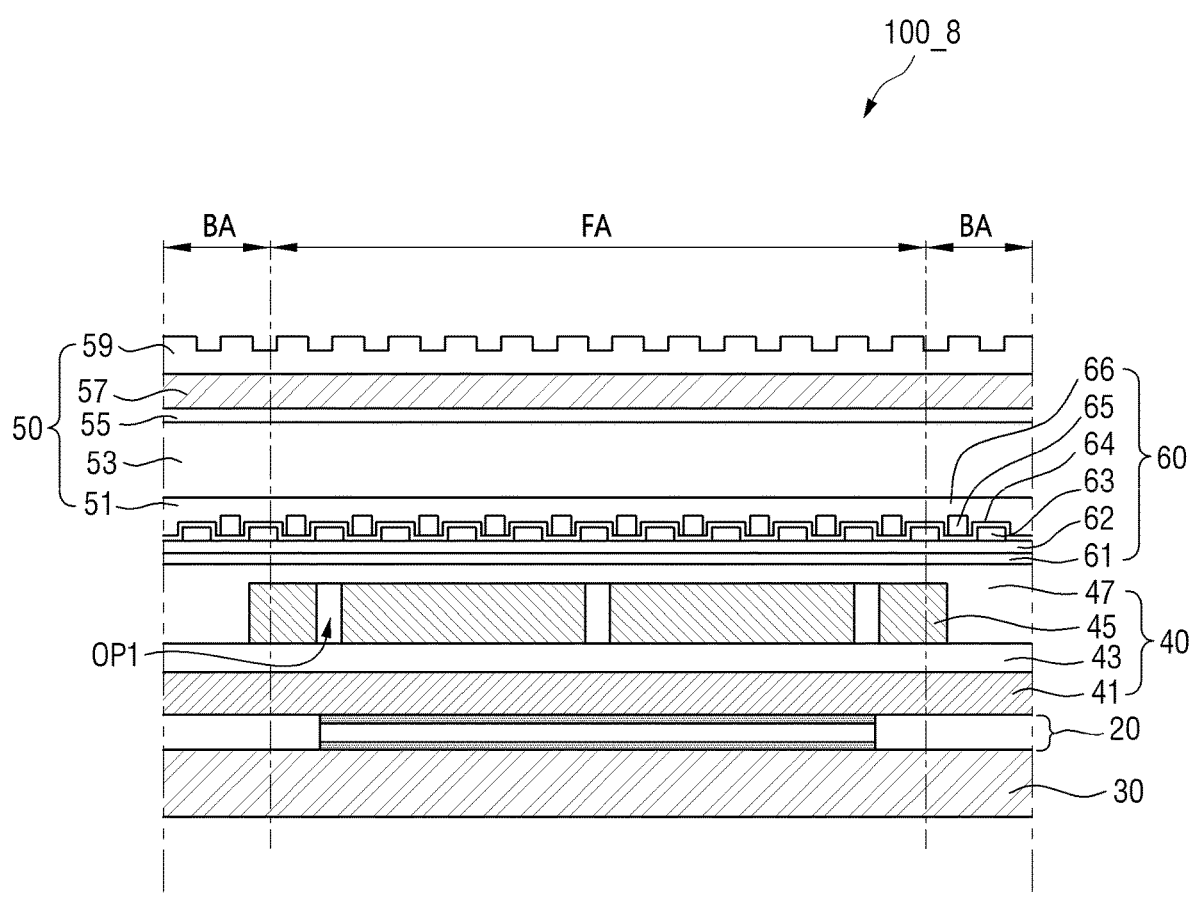
FIG. 17 is a detailed cross-sectional view of a panel bottom sheet according to another exemplary embodiment.

FIG. 17 is a detailed cross-sectional view of a panel bottom sheet according to another exemplary embodiment.

Referring to FIG. 17, a panel bottom sheet 100_8 according to the exemplary embodiment is different from the panel bottom sheet 100 of FIG. 14 in that a digitizer 60 is further included therein. A main sheet 10_8 may include the heat dissipation member 40, the buffering member 50, and the digitizer 60 disposed between the heat dissipation member 40 and the buffering member 50.

In more detail, the panel bottom sheet 100_8 according to the exemplary embodiment may further include the digitizer 60.

The digitizer 60 may be disposed between the buffering member 50 and the heat dissipation member 40. The digitizer 60 is one of input devices and receives position information indicated by a user on a screen unlike input devices such as a keyboard and a mouse. The digitizer 60, for example, recognizes and converts movement of a stylus pen into a digital signal. The digitizer 60 may be provided in the form of a thin film or a panel.

In the exemplary embodiment, the digitizer 60 may include a plurality of electrodes 63 and 65. The plurality of electrodes 63 and 65 may be disposed while being divided into two or more layers. The digitizer 60 may further include a third coupling layer 61 disposed on a top surface of the heat dissipation substrate 47, a first insulating layer 62 disposed on the third coupling layer 61, a second insulating layer 64 disposed on the first insulating layer 62 and the first electrode 63, and a third insulating layer 66 disposed on the second electrode 65. The second insulating layer 64 may cover the first electrode 63, and the third insulating layer 66 may cover the second electrode 65. The buffering member 50 may be disposed on a top surface of the third insulating layer 66.

The first electrode 63 and the second electrode 65 may be separately patterned. Each of the first electrode 63 and the second electrode 65 may include metal such as copper, silver, and the like.

Each of the first insulating layer 62, the second insulating layer 64, and the third insulating layer 66 may include an organic film such as PI and the like or an inorganic film such as silicon oxide, silicon nitride, silicon oxynitride, and the like.

A material of the third coupling layer 61 may be selected from the above-described exemplary materials of the first and second coupling layers 22 and 23.

Even in the exemplary embodiment, the heat dissipation member 40 may reduce processing costs and processing time by employing a method of directly coating the second heat dissipation layer 45 with the heat dissipation substrate 47 instead of attaching a heat dissipation substrate such as PI and the like to the second heat dissipation layer 45 using a coupling layer such as an adhesive layer, a viscous layer, a resin layer, and the like.

Figure 18:
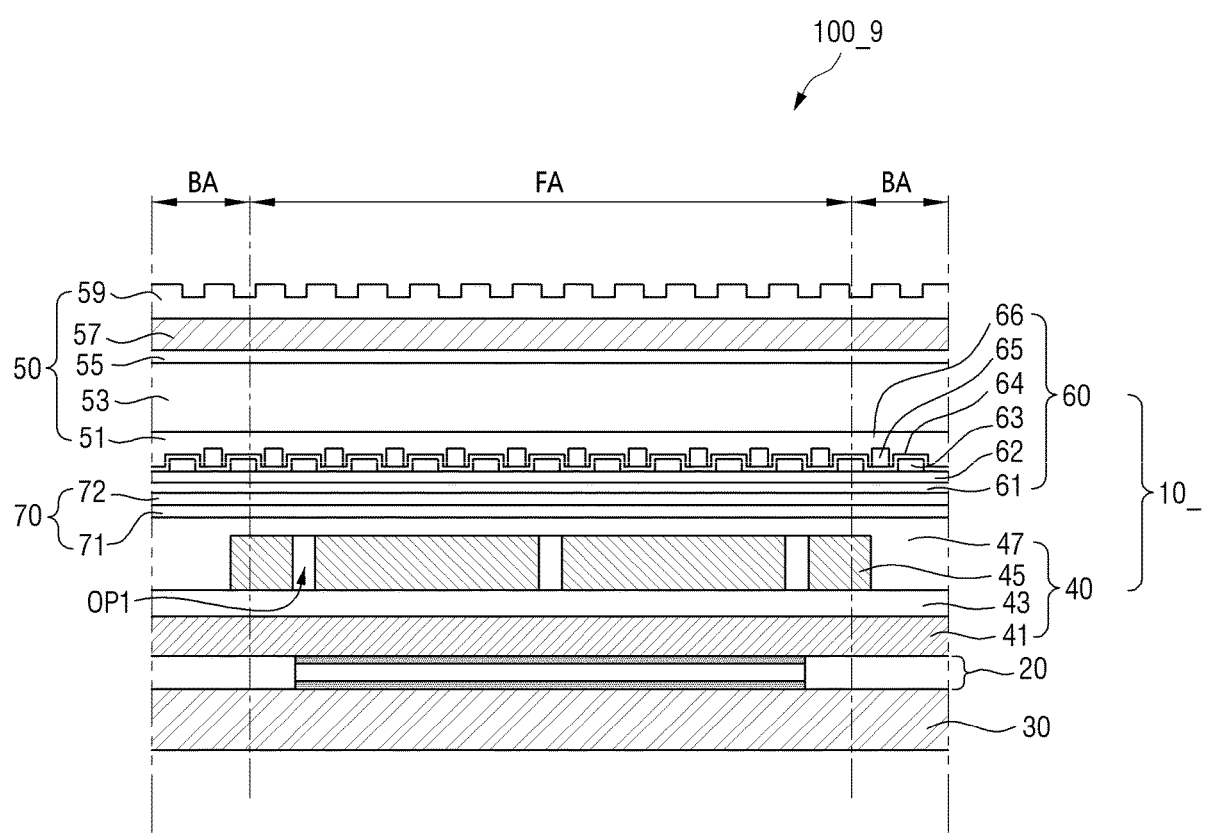
FIG. 18 is a detailed cross-sectional view of a panel bottom sheet according to another exemplary embodiment.

FIG. 18 is a detailed cross-sectional view of a panel bottom sheet according to another exemplary embodiment.

Referring to FIG. 18, a panel bottom sheet 100_9 according to the exemplary embodiment is different from the panel bottom sheet 100_8 of FIG. 17 in that a magnetic field blocking member 70 is further disposed between the digitizer 60 and the heat dissipation member 40. A main sheet 10_9 may further include the blocking member 70 disposed between the heat dissipation member 40 and the digitizer 60 in the main sheet 10_8 of FIG. 17.

In more detail, in the panel bottom sheet 100_9 according to the exemplary embodiment, the magnetic field blocking member 70 may be further disposed between the digitizer 60 and the heat dissipation member 40. The magnetic field blocking member 70 may include a fourth coupling layer 71 disposed on the top surface of the heat dissipation substrate 47 and a magnetic field blocking layer 72 disposed on a top surface of the fourth coupling layer 71. The fourth coupling layer 71 may be disposed between the magnetic field blocking layer 72 and the heat dissipation substrate 47 and perform a function of attaching the magnetic field blocking layer 72 to the heat dissipation substrate 47, and the magnetic field blocking layer 72 may be disposed between the fourth coupling layer 71 and the third coupling layer 61 of the digitizer 60 and may be coupled with the third coupling layer 61 and the fourth coupling layer 71.

The fourth coupling layer 71 may include at least one of the above-described materials included in the first and second coupling layers 22 and 23 but is not limited thereto.

The magnetic field blocking layer 72 may include metal such as copper, silver, and the like. The magnetic field blocking layer 72 may perform a function of blocking magnetic field generated by a plurality of lower components therebelow, for example, an application chip, a camera, battery components, and the like to prevent or suppress the magnetic field from reaching the first and second electrodes 63 and 65 of the digitizer 60 in advance.

Figure 19:
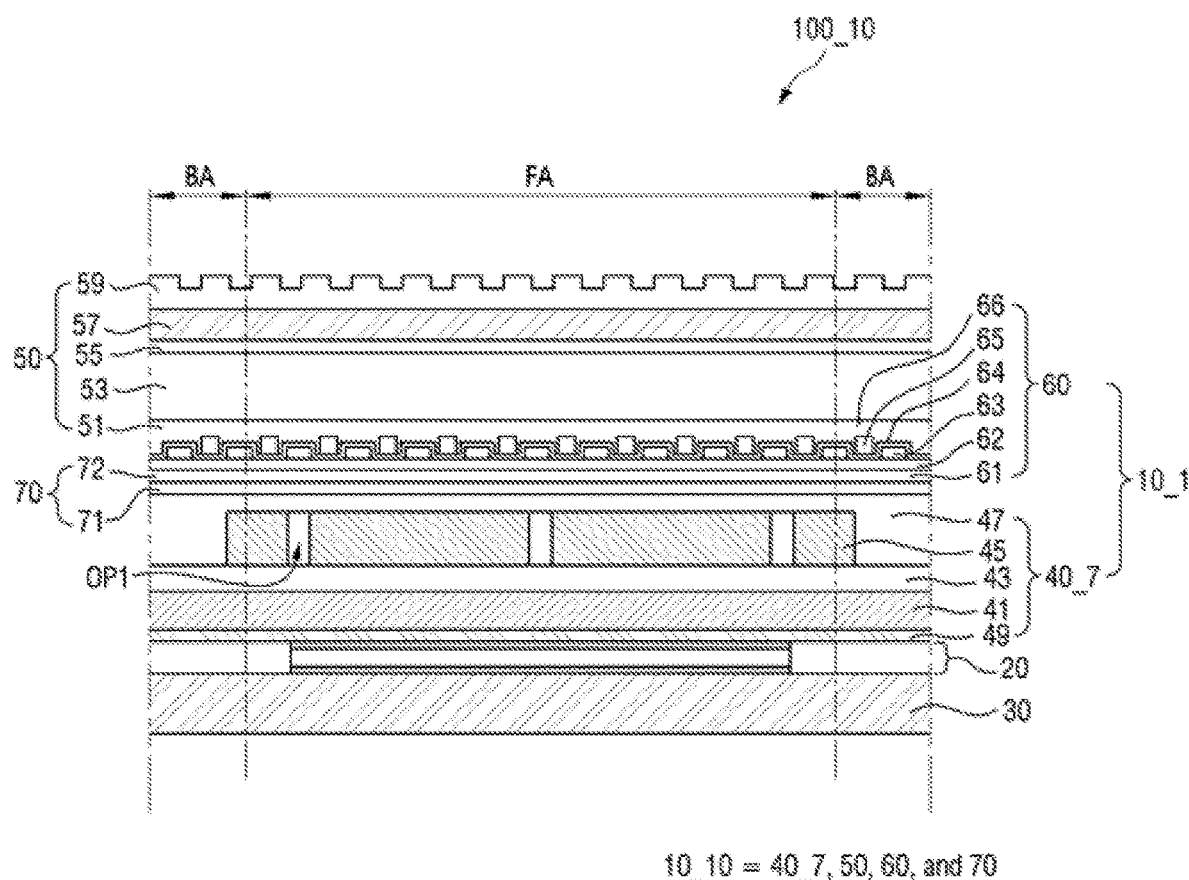
FIG. 19 is a detailed cross-sectional view of a panel bottom sheet according to another exemplary embodiment.

FIG. 19 is a detailed cross-sectional view of a panel bottom sheet according to another exemplary embodiment.

Referring to FIG. 19, a panel bottom sheet 100_10 according to the exemplary embodiment is different from the panel bottom sheet 100_9 of FIG. 18 in that the heat dissipation member 40_7 of FIG. 16 is applicable. A main sheet 10_10 is different from the main sheet 10_9 of FIG. 18 in that the heat dissipation member 40_7 is disposed instead of the heat dissipation member 40.

The heat dissipation paint 49 of the heat dissipation member 40_7, like the magnetic field blocking layer 72, may perform a function of blocking magnetic field generated by a plurality of lower components therebelow, for example, an application chip, a camera, battery components, and the like to prevent or suppress the magnetic field from reaching the first and second electrodes 63 and 65 of the digitizer 60 in advance.

In some embodiments, the magnetic field blocking member 70 may be omitted. Even in this case, the heat dissipation paint 49 is disposed on a bottom surface of the first heat dissipation layer 41 so as to perform a function of blocking magnetic field generated by a plurality of lower components, for example, an application chip, a camera, battery components, and the like to prevent or suppress the magnetic field from reaching the first and second electrodes 63 and 65 of the digitizer 60 in advance.

According to a panel bottom sheet according to an exemplary embodiment, efficiency of processes may be improved.

Effects according to the exemplary embodiments are not restricted by the above exemplified content, and a variety of effects are included in the specification.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A panel bottom sheet comprising:
a first heat dissipation layer including a flat area and at least one bendable area connected to the flat area;
a second heat dissipation layer having circumferential side surfaces located further inside than circumferential side surfaces of the first heat dissipation layer in a plan view and overlapping a part of the at least one bendable area, the second heat dissipation layer comprising:
a main heat dissipation pattern comprising a first opening formed completely through the second heat dissipation layer in a thickness direction; and
a heat dissipation substrate disposed directly on the second heat dissipation layer.

2. The panel bottom sheet of claim 1, wherein the heat dissipation substrate is directly contacting the circumferential side surfaces of the second heat dissipation layer.

3. The panel bottom sheet of claim 2, further comprising a first coupling interlayer disposed between the first heat dissipation layer and the second heat dissipation layer,
wherein at least a part of a top surface of the first coupling interlayer is exposed by the second heat dissipation layer, and the exposed top surface of the first coupling interlayer directly contacts the heat dissipation substrate.

4. The panel bottom sheet of claim 3, wherein the first opening comprises a through hole completely surrounded by the second heat dissipation layer in the plan view.

5. The panel bottom sheet of claim 4, wherein the heat dissipation substrate is disposed in the first opening directly contacting an inner wall of the opening of the second heat dissipation layer.

6. The panel bottom sheet of claim 5, wherein the first coupling interlayer is disposed in the first opening directly contacting the inner wall of the opening of the second heat dissipation layer.

7. The panel bottom sheet of claim 3, wherein the second heat dissipation layer further comprises a plurality of sub-heat dissipation patterns separated from the main heat dissipation pattern having a linear shape extending in one direction,
wherein the second heat dissipation layer further comprises a second opening formed completely through the second heat dissipation layer in a thickness direction, and
wherein a plurality of such second openings are disposed between the sub-heat dissipation patterns and between the main heat dissipation pattern and the sub-heat dissipation pattern in the plan view.

8. The panel bottom sheet of claim 1, wherein the heat dissipation substrate comprises polyamide-imide.

9. The panel bottom sheet of claim 1, wherein the first heat dissipation layer comprises at least one of copper and silver, and the second heat dissipation layer comprises at least one of graphite and carbon nanotubes.

10. The panel bottom sheet of claim 1, further comprising:
a bottom coupling member disposed below the first heat dissipation layer; and
a heat dissipation paint disposed between the bottom coupling member and the first heat dissipation layer.

11. The panel bottom sheet of claim 10, wherein the heat dissipation paint comprises a metal oxide material.

12. The panel bottom sheet of claim 10, further comprising a digitizer disposed on the heat dissipation substrate.

13. A display comprising:
a display panel; and
a panel bottom sheet disposed below the display panel, the panel bottom sheet comprising:
a first heat dissipation layer;
a second heat dissipation layer having circumferential side surfaces located further inside than circumferential side surfaces of the first heat dissipation layer in a plan view;
a heat dissipation substrate disposed directly on the second heat dissipation layer;
a bottom coupling member disposed below the first heat dissipation layer; and
a heat dissipation paint disposed between the bottom coupling member and the first heat dissipation layer.

14. The display of claim 13, wherein the heat dissipation paint comprises a metal oxide material.

15. The display of claim 14, wherein the panel bottom sheet further comprises a buffering member disposed between the heat dissipation substrate and the display panel, the buffering member directly contacting the heat dissipation substrate, and
wherein the display panel having a thickness of 120 μm to 180 μm.

16. The display of claim 14, comprising:
a flat area; and
a bending area located on a periphery of the flat area,
wherein the display panel and the panel bottom sheet overlap with the flat area and the bending area.

17. The display of claim 16, wherein the second heat dissipation layer overlaps with the flat area and a part of the bending area, and wherein the first heat dissipation layer overlaps with the flat area and an entire surface of the bending area.

18. The display of claim 17, wherein the second heat dissipation layer comprises a main heat dissipation pattern comprising a first opening formed completely through the second heat dissipation layer in a thickness direction, and wherein the main heat dissipation pattern is located in the flat area.

19. The display of claim 18, wherein the first opening comprises a through hole completely surrounded by the second heat dissipation layer in a plan view.

20. The display of claim 19, wherein the heat dissipation substrate is disposed in the first opening directly contacting an inner wall of the first opening of the second heat dissipation layer.

21. The display of claim 18, wherein the second heat dissipation layer further comprises a plurality of sub-heat dissipation patterns separated from the main heat dissipation pattern having a linear shape extending in one direction, wherein the second heat dissipation layer further comprises a second opening formed completely through the second heat dissipation layer in a thickness direction, and wherein a plurality of such second openings are disposed between the sub-heat dissipation patterns and between the main heat dissipation pattern and the sub-heat dissipation pattern in the plan view.

22. The display of claim 21, wherein the sub-heat dissipation patterns are located in the bending area.

23. A display comprising:

a display panel including a flat area and at least one bendable area connected to the flat area; and a panel bottom sheet disposed below the display panel, the panel bottom sheet comprising:

a first heat dissipation layer;

a second heat dissipation layer including side surfaces located further inside than side surfaces of the first heat dissipation layer and overlapping a part of the at least one bendable area;

a heat dissipation substrate disposed directly on the second heat dissipation layer; and a buffering member disposed between the heat dissipation substrate and the display panel, the buffering member having a thickness of 120 μm to 180 μm.

* * * * *